US011876009B2

(12) United States Patent
Torazawa et al.

(10) Patent No.: US 11,876,009 B2
(45) Date of Patent: Jan. 16, 2024

(54) OVERHEAD TRANSPORT VEHICLE

(71) Applicant: MURATA MACHINERY, LTD., Kyoto (JP)

(72) Inventors: Masayoshi Torazawa, Inuyama (JP); Masataka Hayashi, Inuyama (JP)

(73) Assignee: MURATA MACHINERY, LTD., Kyoto (JP)

( * ) Notice: Subject to any disclaimer, the term of this patent is extended or adjusted under 35 U.S.C. 154(b) by 397 days.

(21) Appl. No.: 17/289,784

(22) PCT Filed: Sep. 30, 2019

(86) PCT No.: PCT/JP2019/038474
§ 371 (c)(1),
(2) Date: Apr. 29, 2021

(87) PCT Pub. No.: WO2020/095570
PCT Pub. Date: May 14, 2020

(65) Prior Publication Data
US 2021/0398835 A1 Dec. 23, 2021

(30) Foreign Application Priority Data
Nov. 6, 2018 (JP) .................. 2018-208651

(51) Int. Cl.
*B61B 3/02* (2006.01)
*B65G 1/06* (2006.01)
(Continued)

(52) U.S. Cl.
CPC .......... *H01L 21/67733* (2013.01); *B61B 3/02* (2013.01); *B65G 1/0457* (2013.01);
(Continued)

(58) Field of Classification Search
CPC ......... H01L 21/67733; H01L 21/67724; H01L 21/6773; B61B 3/02; B65G 1/0457; B65G 1/06; B65G 47/61; B65G 47/902
(Continued)

(56) References Cited

U.S. PATENT DOCUMENTS 6,468,021 B1 * 10/2002 Bonora ............. H01L 21/67763
414/217
7,578,650 B2 * 8/2009 Aalund ............. H01L 21/67775
414/217
(Continued)

FOREIGN PATENT DOCUMENTS

| JP | 2001-225909 A | 8/2001 |
| JP | 2002-373926 A | 12/2002 |

(Continued)

OTHER PUBLICATIONS

Official Communication issued in International Patent Application No. PCT/JP2019/038474, dated Dec. 17, 2019.

*Primary Examiner* — Douglas A Hess
(74) *Attorney, Agent, or Firm* — Keating & Bennett, LLP

(57) ABSTRACT

An overhead transport vehicle travels along a rail on a ceiling of a building to transport a FOUP. The overhead transport vehicle includes a holding base and an upper shelf transfer device. The holding base holds at least one of a side surface and a bottom surface of the FOUP. The upper shelf transfer device moves the holding base at least upwardly while holding the FOUP. The upper shelf transfer device moves the holding base from the holding position in which the holding base holds and transfers the FOUP to the upper transfer position to transfer the FOUP, which is a different position from the holding position in a plan view and higher than the holding position.

15 Claims, 17 Drawing Sheets

(51) Int. Cl.
*B65G 47/61* (2006.01)
*H01L 21/677* (2006.01)
*B65G 1/04* (2006.01)
*B65G 47/90* (2006.01)

(52) U.S. Cl.
CPC .............. *B65G 1/06* (2013.01); *B65G 47/61* (2013.01); *B65G 47/902* (2013.01); *H01L 21/6773* (2013.01); *H01L 21/67724* (2013.01); *B65G 2201/0297* (2013.01)

(58) Field of Classification Search
USPC ....................................................... 198/347.3
See application file for complete search history.

(56) References Cited

U.S. PATENT DOCUMENTS

| | | | | |
|---|---|---|---|---|
| 7,637,707 B2 * | 12/2009 | Perlov | ............... | H01L 21/67167 414/940 |
| 7,661,919 B2 * | 2/2010 | Bonora | ............. | H01L 21/67736 414/222.01 |
| 7,753,639 B2 * | 7/2010 | Hoshino | .............. | B65G 1/0464 414/940 |
| 8,070,410 B2 * | 12/2011 | Rebstock | .......... | H01L 21/67766 414/217 |
| 8,382,417 B2 * | 2/2013 | Yoshida | ............ | H01L 21/67733 414/626 |
| 8,602,706 B2 * | 12/2013 | Hofmeister | ....... | H01L 21/67742 414/217 |
| 8,944,739 B2 * | 2/2015 | Chen | ................. | H01L 21/67733 414/217 |
| 9,011,068 B2 * | 4/2015 | Inui | ................... | H01L 21/67706 414/940 |
| 9,187,260 B2 * | 11/2015 | Ota | ................... | H01L 21/67733 |
| 9,224,628 B2 * | 12/2015 | Bufano | ............... | H01L 21/6773 |
| 9,356,822 B2 * | 5/2016 | Jensen | .................... | H04L 67/34 |
| 9,633,881 B2 * | 4/2017 | Rebstock | .......... | H01L 21/67276 |
| 11,024,527 B2 * | 6/2021 | Flitsch | ................ | B65G 65/005 |
| 11,664,255 B2 * | 5/2023 | Nirschl | ............... | B25J 15/02 414/281 |
| 2007/0081879 A1 | 4/2007 | Bonora et al. | | |
| 2019/0031440 A1 | 1/2019 | Ito | | |

FOREIGN PATENT DOCUMENTS

| | | |
|---|---|---|
| JP | 2009-510776 A | 3/2009 |
| JP | 2017-030944 A | 2/2017 |
| WO | 2017/141555 A1 | 8/2017 |

\* cited by examiner

OVERHEAD TRANSPORT VEHICLE

BACKGROUND OF THE INVENTION

1. Field of the Invention

The present invention mainly relates to an overhead transport vehicle.

2. Description of the Related Art

Conventionally, an overhead transport vehicle for transporting articles along a rail disposed on a ceiling is used in, for example, a factory for manufacturing semiconductor products. The factory sometimes has a shelf where articles transported by the overhead transport vehicle are temporarily stored. A transport system including the overhead transport vehicle and shelf as mentioned above is disclosed in Japanese Patent Application Laid-Open No. 2017-30944.

The overhead transport vehicle according to Japanese Patent Application Laid-Open No. 2017-30944 includes an elevator device for lowering articles and a lateral transfer device for laterally moving articles. Japanese Patent Application Laid-Open No. 2017-30944 has a plurality of shelves, which are supported by poles and are arranged one above another. The overhead transport vehicle is capable of lowering articles to a predetermined height of the shelf with the elevator device, and then laterally moving the articles, to place the articles in the shelf.

In a factory for manufacturing semiconductor products like the one shown in Japanese Patent Application Laid-Open No. 2017-30944, as the processing speed of a processing apparatus increases, a capacity for storing additional articles may be required. Not only factories for manufacturing semiconductor products but also various buildings where overhead transport vehicles are disposed may be required to have a configuration capable of storing additional articles, too.

SUMMARY OF THE INVENTION

Preferred embodiments of the present invention provide overhead transport vehicles that are each able to place articles at a position where articles could not be placed conventionally.

The problem to be solved by various preferred embodiments of the present invention is described above. In the following, solutions to the problem as well as advantageous effects thereof will be described.

A preferred embodiment of the present invention provides an overhead transport vehicle as described below. The overhead transport vehicle travels along a rail provided on a ceiling of a building to transport an article. The overhead transport vehicle includes a first holder and a first transfer device. The first holder holds at least one of a side surface and a bottom surface of the article. The first transfer device moves the first holder at least upwardly while holding the article. The first transfer device moves the first holder from a holding position in which the first holder holds and transfers the article to an upper transfer position to transfer the article which is a different position from the holding position in a plan view and higher than the holding position.

Accordingly, the articles are able to be placed at a high position in a space that has conventionally not been available to place articles, which provides more effective use of a space in the building.

In the overhead transport vehicle described above, the first transfer device may move the first holder downward.

Accordingly, the first transfer device is able to transfer the article to any of the upper or lower positions.

The first transfer device may move the first holder in a lateral direction through a first movement in which components of a moving direction includes a lateral direction, may move the first holder upward through a second movement in which components of a moving direction includes an upward direction, and may transfer the article to the upper transfer position.

Accordingly, the first holder is able to be moved to the upper transfer position while preventing interference between the overhead transport vehicle and the article.

The overhead transport vehicle may include a driver and an operator. The operator may enable the upper shelf to be transferred the article by providing a driving force generated by the driver to the upper shelf positioned at the upper transfer position. The driver and the operator may be moved in the lateral direction by the first movement.

According to the driving force generated by the driver of the overhead transport vehicle, a driver on the upper shelf side is no longer required. In addition, because the driver and the operator are able to be moved in the lateral direction, the operator is able to be closer to the upper shelf by using the same mechanism as the article.

The first transfer device may move the first holder in a lateral direction through a first movement in which components of a moving direction includes a lateral direction, may move the first holder downward through a second movement in which components of a moving direction includes a downward direction, and may transfer the article to a lower transfer position.

Accordingly, the first holder is able to be moved to the lower transfer position while preventing interference between the overhead transport vehicle and the article.

In the overhead transport vehicle described above, the first transfer device may raise the first holder to at least the same height as the rail.

Accordingly, a space at the same height of the rail is able to be effectively used.

The overhead transport vehicle may include a second holder and a second transfer device. The second holder may hold at least one of a side surface and a top surface of the article. The second transfer device may move the second holder at least downwardly while holding the article.

Accordingly, the article is able to be placed not only at a position higher than the overhead transport vehicle, but also at a position lower than the overhead transport vehicle. As a result, the space in the building is able to be used further effectively.

The first transfer device may include a retraction mechanism that retracts the first holder from a trajectory of the second holder being moved downward by the second transfer device.

Accordingly, the article is able to be transferred downward while preventing interference between the first holder and the article.

The second transfer device may move the second holder in a lateral direction through a third movement in which components of a moving direction includes a lateral direction, may move the second holder downward through a fourth movement in which components of a moving direction includes a downward direction, and may transfer the article to a lower transfer position. The first transfer device may move the first holder upward to a higher position than a height of the first holder when the second transfer device moves the first holder in the lateral direction.

Accordingly, interference between the article transferred to the upper transfer position and the second transfer device is able to be prevented, and even after an article is transferred to the upper transfer position, another article is able to be transferred to the lower transfer position.

In the overhead transport vehicle described above, a lower end position of the first transfer device after the first movement may be higher than an upper end of the article transferred to the lower transfer position.

Accordingly, even if the first transfer device is moved in the lateral direction, the first transfer device and the article transferred to the lower transfer position do not interfere with each other.

The first transfer device may include a lateral slide mechanism and upward slide mechanism. The lateral slide mechanism may slide the first holder in a lateral direction. The upward slide mechanism may slide the first holder in the upward direction.

Accordingly, the first transfer device is able to be implemented with a simple structure.

The overhead transport vehicle may include an arm mechanism including a plurality of arms rotatably connected to each other. The arms may be operated independently to move the first holder from the holding position to the upper transfer position.

Accordingly, the first transfer device is able to be implemented with a simple structure.

The article may be a wafer transport container to transport wafers. The first holder may include a holding surface and an insertion pin. The holding surface may hold the wafer transport container. The insertion pin may be provided on the holding surface and may be inserted into a recess in a lower surface of the wafer transport container.

Accordingly, since the first holder includes the holding surface and the insertion pin, the wafer transport container is able to be transferred stably.

The overhead transport vehicle may transport the wafer transport container by traveling along the rail with the first holder holding the wafer transport container.

Accordingly, the wafer transport container is able to be transported in a stable state.

The article may be a wafer transport container that transports wafers. The second holder may be a chuck that holds a flange portion of the top surface of the wafer transport container.

Accordingly, the top surface of the wafer transport container is able to be held by the second holder with a simple structure.

The overhead transport vehicle may switch the article between the first holder and the second holder while traveling along the rail.

Accordingly, articles are able to be transferred promptly after the overhead transport vehicle stops.

The above and other elements, features, steps, characteristics, and advantages of the present invention will become more apparent from the following detailed description of the preferred embodiments with reference to the attached drawings.

DETAILED DESCRIPTION OF THE PREFERRED EMBODIMENTS

Figure 1:
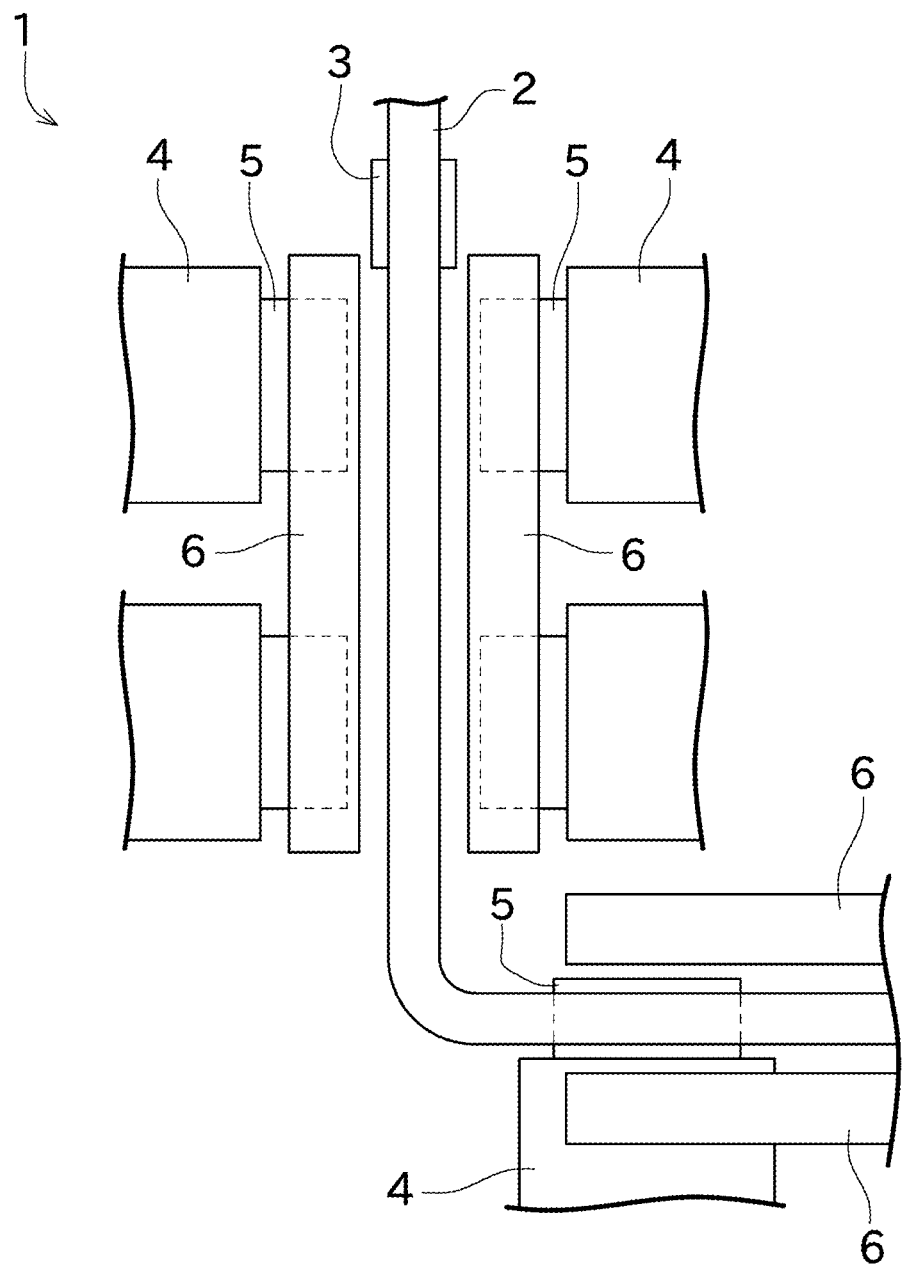
FIG. 1 is a plan view showing a transport system including an overhead transport vehicle according to a first preferred embodiment of the present invention.

Preferred embodiments of the present invention will be described with reference to the drawings. First, referring to FIG. 1, overview of a transport system 1 will be described. FIG. 1 is a plan view showing the transport system 1 according to a first preferred embodiment of the present invention.

The transport system 1 of this preferred embodiment, which may be installed in a factory (building, facility) to manufacture semiconductor products, is a system to transport various articles. Articles transported by the transport system 1 of this preferred embodiment may be FOUPs (Front-Opening Unified Pods) in which wafers (semiconductor wafers) are contained. The articles may be reticle pods in which reticles are contained. As shown in FIG. 1, the transport system 1 includes a rail 2, an overhead transport vehicle 3, and ceiling suspended shelves 6.

The rail 2 is provided on a ceiling 7 of the factory. The overhead transport vehicle 3 is able to travel along the rail 2 while being suspended. Two or more overhead transport vehicles 3 may be provided, though only one overhead transport vehicle 3 is shown in FIG. 1.

In the factory, processing apparatuses 4 and load ports 5 are provided. The processing apparatus 4 is an apparatus that performs various processes on wafers contained in a FOUP. The load port 5 is connected to a space where the processing apparatus 4 performs processes. A FOUP transported by the overhead transport vehicle 3 is placed on the load port 5. Wafers in the FOUP are taken out, and then are processed by the processing apparatus 4. After being processed, the wafers are brought into the FOUP, then the same or another overhead transport vehicle 3 transports this FOUP to a position where another step is performed. Here, the load port 5 may be located below the ceiling suspended shelves 6 as shown in FIG. 1, or the load port 5 and a temporary storage shelf (not shown) may be located below the rail 2.

The ceiling suspended shelves 6 are provided on the ceiling 7 of the factory. The ceiling suspended shelves 6 are shelves where FOUPs, etc. are temporarily placed when, for example, the processing apparatus 4 and the load port 5, which are target positions, are occupied (in use). The FOUPs, etc. are temporarily placed there until the processing apparatus 4 and the load port 5 become unoccupied (available). In this preferred embodiment, the ceiling suspended shelves 6 are provided in parallel or substantially in parallel to the rail 2 and along the longitudinal direction of the rail 2. Although the ceiling suspended shelves 6 of this preferred embodiment are located on both sides of the rail 2, a ceiling suspended shelf 6 may be located on one side only.

Next, referring to FIG. 2 to FIG. 6, a detailed description will be provided for the rail 2, the overhead transport vehicle 3, and the ceiling suspended shelves 6. In perspective views in FIG. 3, etc., the ceiling suspended shelf 6 provided on one side of the rail 2 is not shown.

Figure 2:
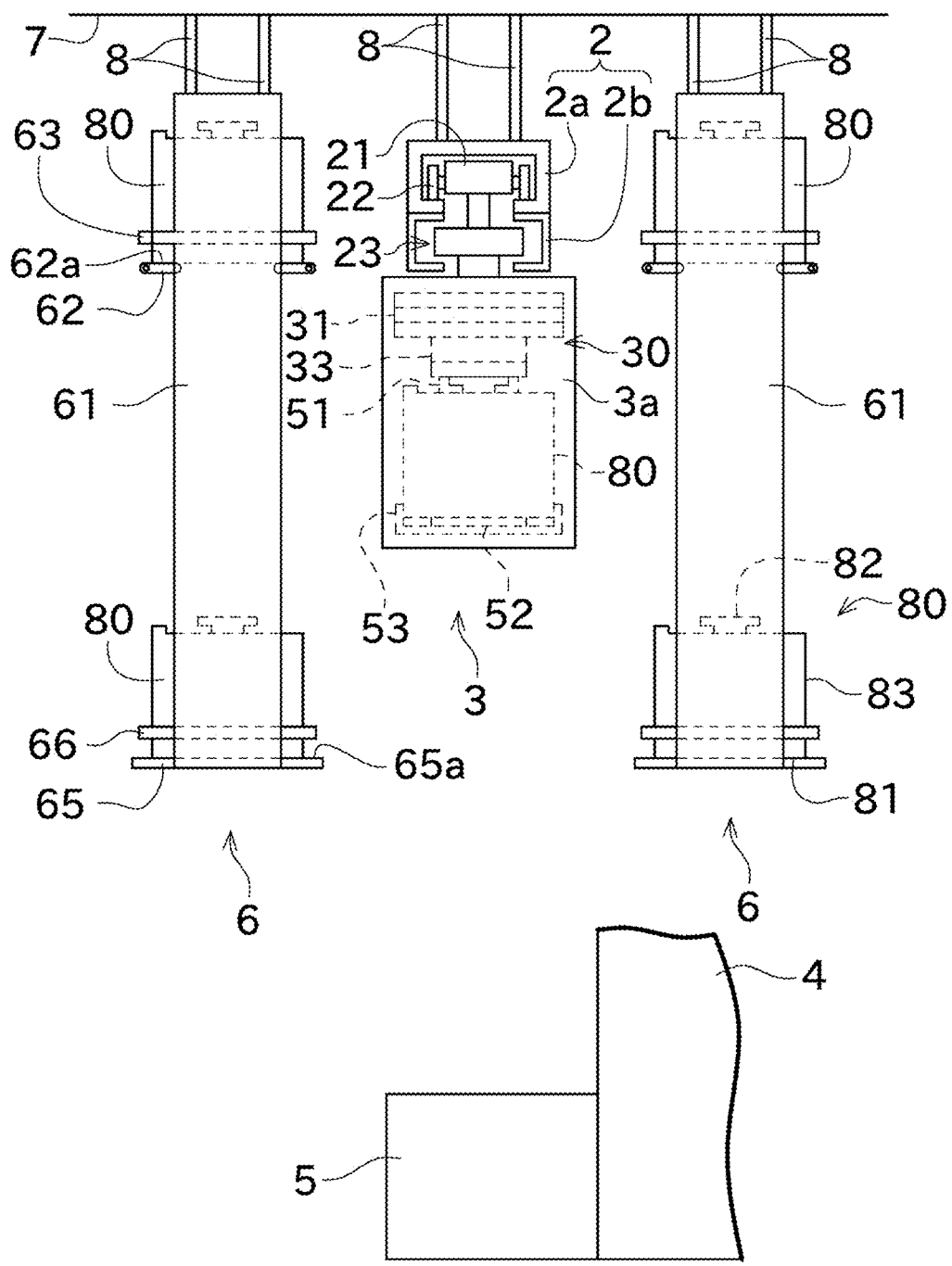
FIG. 2 is a front view showing an overhead transport vehicle and ceiling suspended shelves.

As shown in FIG. 2, poles 8 are connected to the ceiling 7 of the factory. By the poles 8, the rail 2 and the ceiling suspended shelves 6 are suspended from the ceiling 7. The overhead transport vehicle 3 is suspended from the ceiling 7 via the poles 8 and the rail 2.

Figure 3:
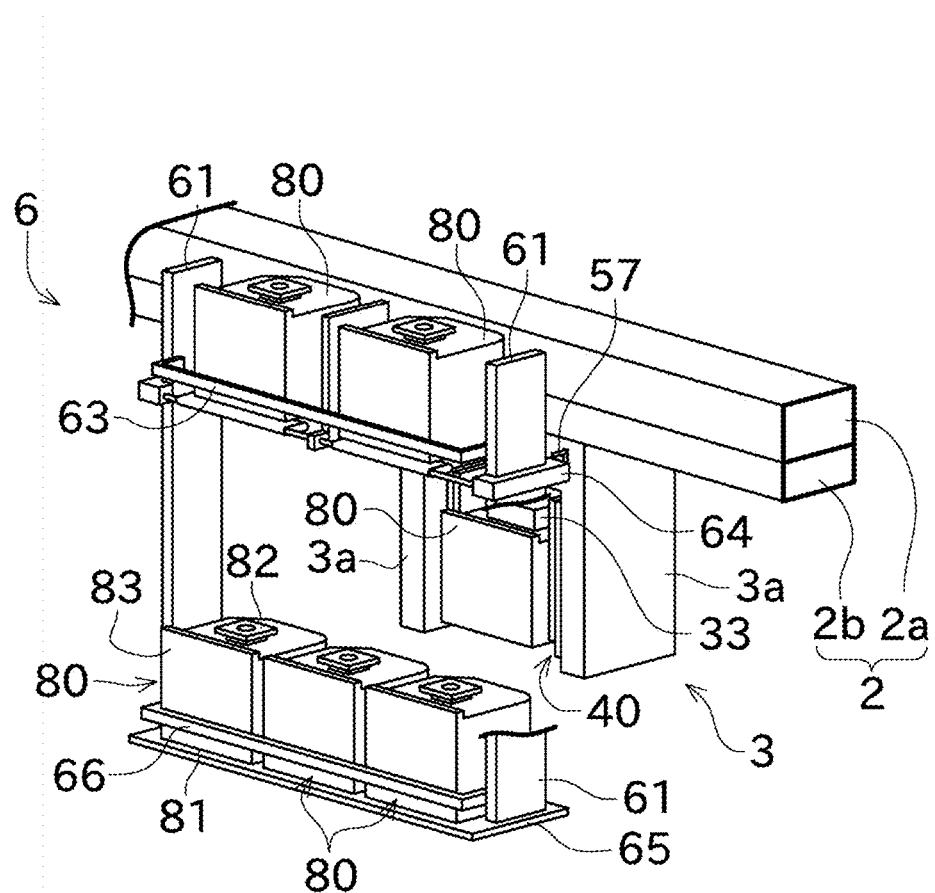
FIG. 3 is a perspective view showing the overhead transport vehicle and the ceiling suspended shelf.

As shown in FIG. 2 and FIG. 3, the ceiling suspended shelf 6 includes side plates 61, an upper shelf (first shelf) 62, and a lower shelf (second shelf) 65. The side plates 61 are suspended from the ceiling 7 by the poles 8. The side plates 61 support the upper shelf 62 and the lower shelf 65. The side plates 61 are provided at regular intervals. A space provided between two side plates 61 corresponds to one compartment. The ceiling suspended shelf 6 includes two or more compartments that are identical or substantially identical and that are continuously provided.

According to the structure of the upper shelf 62, two FOUPs 80 are able to be placed in one compartment. The upper shelf 62 is located at a position higher than the lower shelf 65. An upper support surface 62*a* (FIG. 2, the first support surface) of the upper shelf 62, which supports a FOUP 80, has substantially the same height as that of the rail 2. To be specific, the level of the upper support surface 62*a* is located between a vicinity of the lower end of the rail 2 and a vicinity of the upper end of the rail 2. Here, the wording "substantially the same" is used to encompass a case where the level of the upper support surface 62*a* is slightly lower than the lower end of the rail 2 and a case where the level of the upper support surface 62*a* is slightly higher than the upper end of the rail 2. The level at which the upper support surface 62*a* supports a FOUP 80 is higher than the level at which the overhead transport vehicle 3 supports a FOUP 80 while traveling, and is higher than the level at which the load port 5 supports a FOUP 80. The level of the upper support surface 62*a* is higher than the upper end of a lower shelf transfer device 30 which will be described later.

The upper support surface 62*a* is at a position displaced from the overhead transport vehicle 3 with respect to the horizontal direction, and is located at a position higher than the overhead transport vehicle 3.

The ceiling suspended shelf 6 has an upper side surface guide 63, which faces a side surface 83 of a FOUP 80. The presence of the upper side surface guide 63 is able to prevent a FOUP 80 that is placed in the upper shelf 62 from dropping, mispositioning, and the like. The upper side surface guide 63 is located at a position higher than the lower end of the rail 2. The upper side surface guide 63, however, is just required to be positioned higher than the upper support surface 62*a*, and it is not always necessary that the upper side surface guide 63 be located at a position higher than the lower end of the rail 2.

Figure 5:
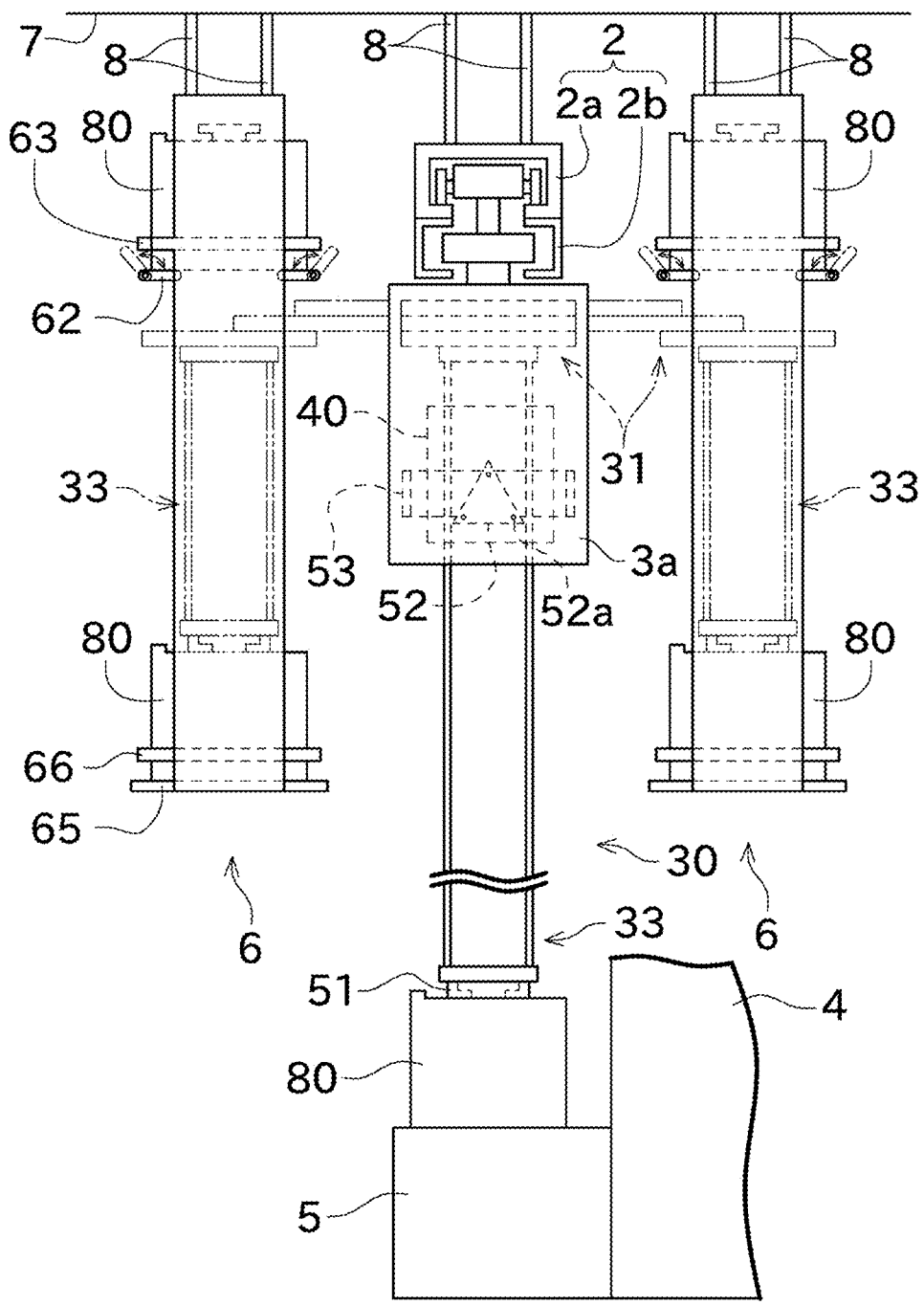
FIG. 5 is a front view showing a lower shelf transfer device of the overhead transport vehicle.

As shown in FIG. 5, the upper shelf 62 is able to rotate about a predetermined rotation axis, to thus be opened and closed. More specifically, the upper shelf 62 is able to be brought into an open state (chain lines in FIG. 5) where the upper shelf 62 is positioned outside to allow a FOUP 80 to pass therethrough from below and a closed state where the upper shelf 62 is positioned inside so that its opening is partially or entirely closed to support a FOUP 80.

The ceiling suspended shelf 6 includes a switching mechanism 64 (FIG. 3 and FIG. 4) to switch the state of the upper shelf 62 between the open state and the closed state. The switching mechanism 64 includes a gear, a link, and the like, to transmit power received from the outside. In this preferred embodiment, the ceiling suspended shelf 6 does not have a driver to switch the state of the upper shelf 62, but power received from the overhead transport vehicle 3 is used to switch the state of the upper shelf 62 between the open state and the closed state.

Figure 4:
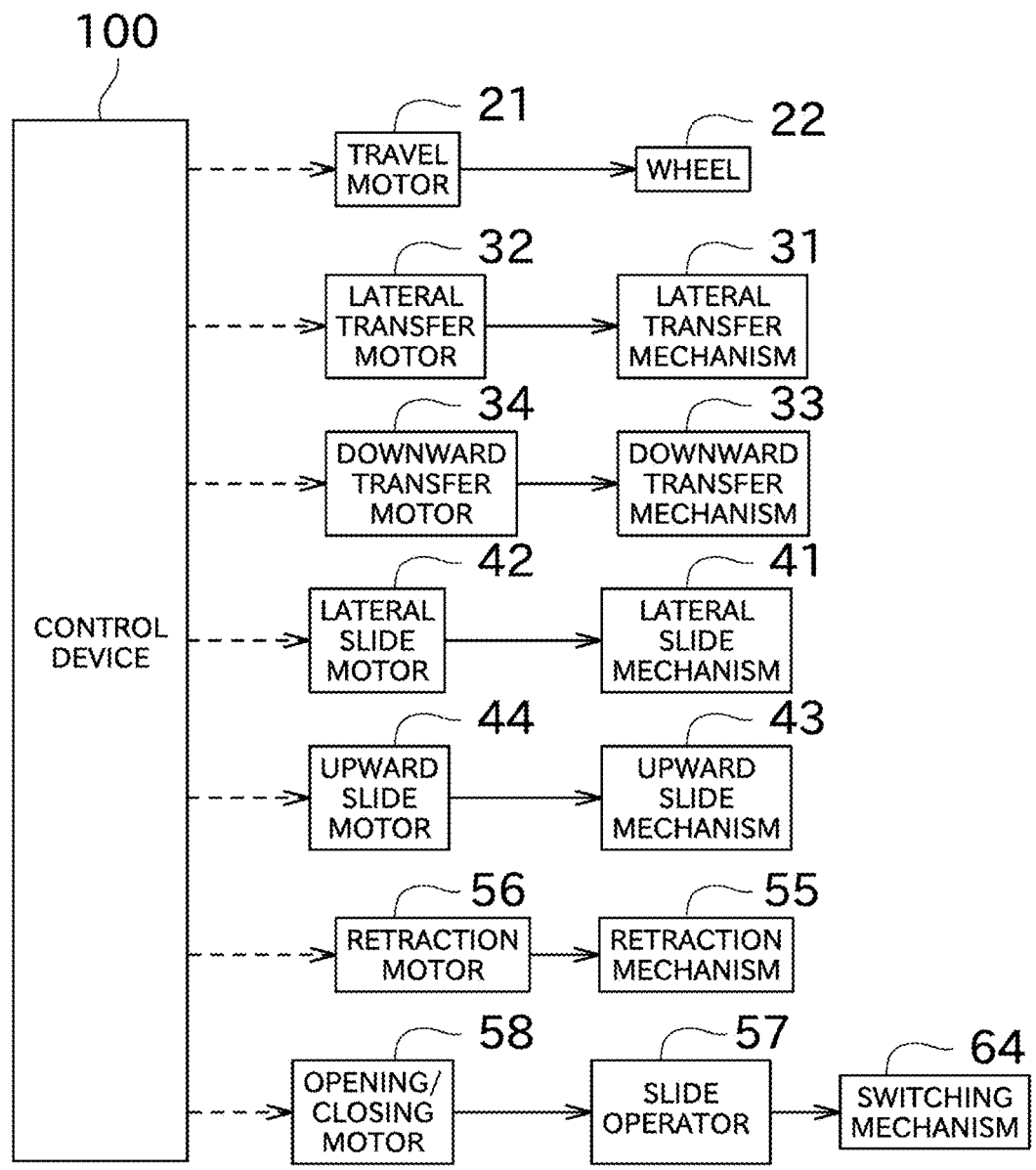
FIG. 4 is a block diagram showing a driver, and the like, provided mainly in the overhead transport vehicle.

To be specific, the overhead transport vehicle 3 includes a slide operator (operator) 57 that operates the switching mechanism 64. As shown in FIG. 4, the slide operator 57 is driven by an opening/closing motor (driver) 58. The slide operator 57 is able to change its position between a normal position and a pressing position. When the slide operator 57 is in the normal position, the slide operator 57 is not in contact with the switching mechanism 64, and the upper shelf 62 is in the closed state. When the slide operator 57 is in the pressing position, the slide operator 57 operates the switching mechanism 64 to switch the state of the upper shelf 62 to the open state.

In this preferred embodiment, switching between the open state and the closed state is implemented by rotation of the upper shelf 62. Instead, switching between the open state and the closed state may be implemented by sliding of the upper shelf 62. Alternatively or additionally, the ceiling suspended shelf 6 may be provided with a driver to switch the state of the upper shelf 62.

According to the structure of the lower shelf 65, three FOUPs 80 are able to be placed in one compartment. That is, in the lower shelf 65, as compared to the upper shelf 62, a greater number of FOUPs 80 are able to be placed in one compartment (i.e., per unit length). This difference is caused by the fact that upper shelf 62 and the lower shelf 65 are different from each other in terms of a mechanism to place a FOUP 80, details of which will be described later. The lower shelf 65 is located at a position lower than the upper shelf 62. The level at which a lower support surface 65*a* (the second support surface) of the lower shelf 65 supports a FOUP 80 is lower than the level at which the overhead transport vehicle 3 supports a FOUP 80 while traveling, and is higher than the level at which the load port 5 supports a FOUP 80. The upper end of a FOUP 80 supported by the lower support surface 65a is located below the lower end of a later-described upper shelf transfer device 40 (and more specifically, below the lower end of the upper shelf transfer device 40 after lateral movement thereof).

The lower shelf 65 is always in the closed state, and its state is not able to be switched, unlike the upper shelf 62. In other words, the lower shelf 65 does not allow a FOUP 80 to pass therethrough in the up-down direction. A specific structure of the lower shelf 65 is a shelf board that connects adjacent side plates 61.

The ceiling suspended shelf 6 includes a lower side surface guide 66, which faces a side surface 83 of a FOUP 80. The presence of the lower side surface guide 66 is able to prevent a FOUP 80 that is placed in the lower shelf 65 from dropping, mispositioning, and the like.

The rail 2 includes a travel rail 2a and an electricity supply rail 2b. The travel rail 2a includes a travel support surface that supports the overhead transport vehicle 3 (and specifically a wheel 22 which will be described later), and that allows the overhead transport vehicle 3 to travel. The electricity supply rail 2b is provided on the lower side of the travel rail 2a. The electricity supply rail 2b, in which an electricity supply line (not shown) is provided, supplies electric power to the overhead transport vehicle 3.

The overhead transport vehicle 3 includes a travel motor 21, a wheel 22, and an electricity receiver 23, which enable the overhead transport vehicle 3 to travel along the rail 2. The travel motor 21 is provided in the travel rail 2a. The travel motor 21 generates power to enable the overhead transport vehicle 3 to travel. The wheel 22 is provided in contact with the above-mentioned travel support surface of the travel rail 2a. The wheel 22 is driven into rotation by the travel motor 21. The electricity receiver 23 is provided in the electricity supply rail 2b. The electricity receiver 23, which is, for example, a pick-up coil that receives electric power from the electricity supply line of the electricity supply rail 2b, supplies electric power received from the electricity supply line to electric devices such as the travel motor 21.

As shown in FIG. 4, various drive sources and electric devices, for example, the travel motor 21, are controlled by a controller 100. The controller 100 may be implemented as a computer provided at an appropriate position in the overhead transport vehicle 3. The controller 100 includes an arithmetic processor such as a CPU, a memory such as a flash memory or a hard disk, and an input/output to communicate with external devices or the like. The memory stores various programs and set values. The arithmetic processor reads out various programs, and the like, from the memory, and controls operations of respective portions of the overhead transport vehicle 3.

As shown in FIG. 3, the overhead transport vehicle 3 includes a pair of coverings 3a, which are provided one behind the other with respect to a travel direction. A structure hold and transfer a FOUP 80 is located between the pair of coverings 3a.

As shown in FIG. 2, etc., the overhead transport vehicle 3 includes a chuck (second holder) 51 and a holding base (first holder) 52, which are able to hold a FOUP 80. The chuck 51 holds by gripping a flange portion 82 of an upper surface of the FOUP The chuck 51 is switchable between holding and not holding the flange portion 82.

Figure 6:
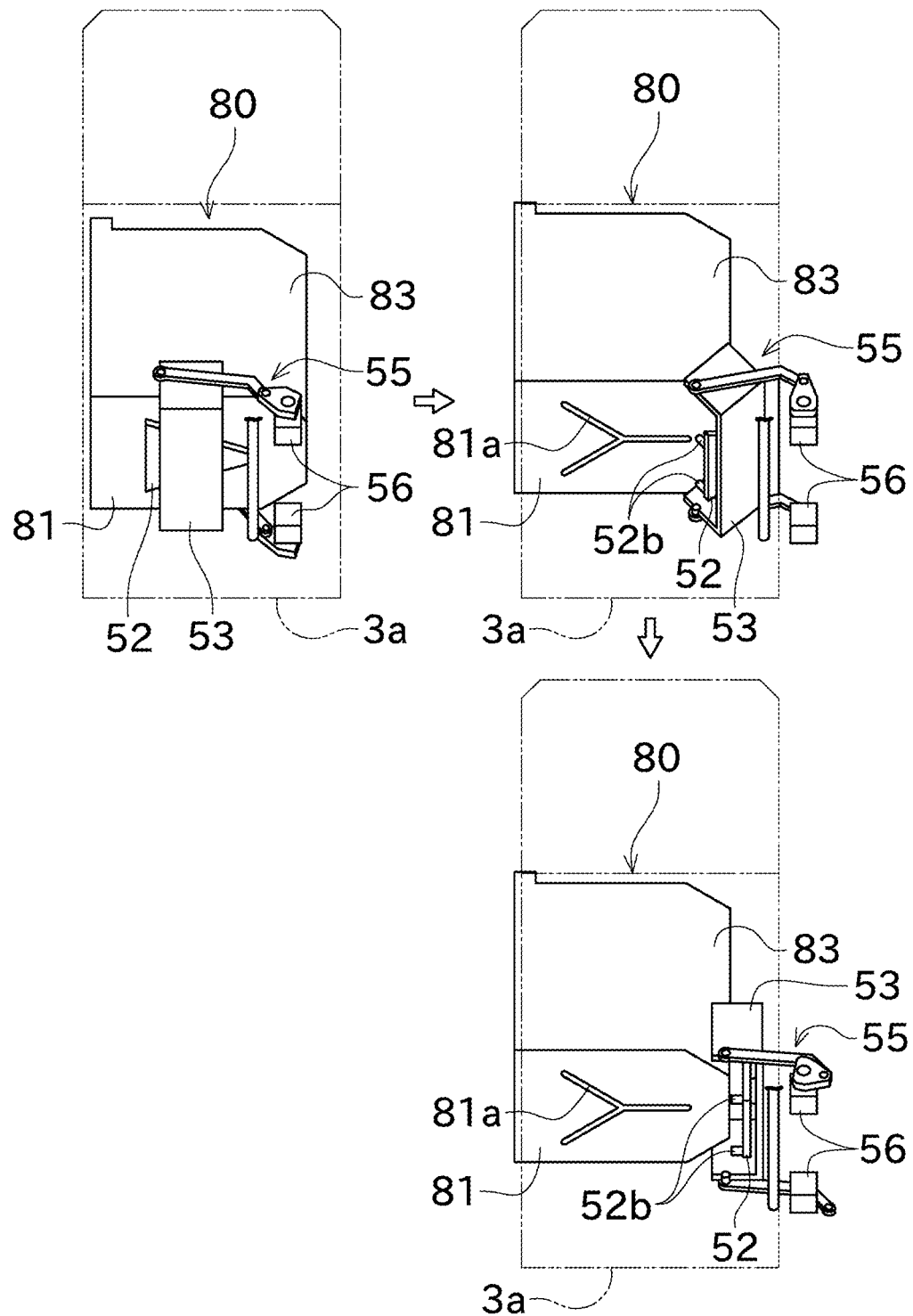
FIG. 6 is a perspective view showing a retraction mechanism provided on the bottom surface side of a FOUP.
Figure 9:
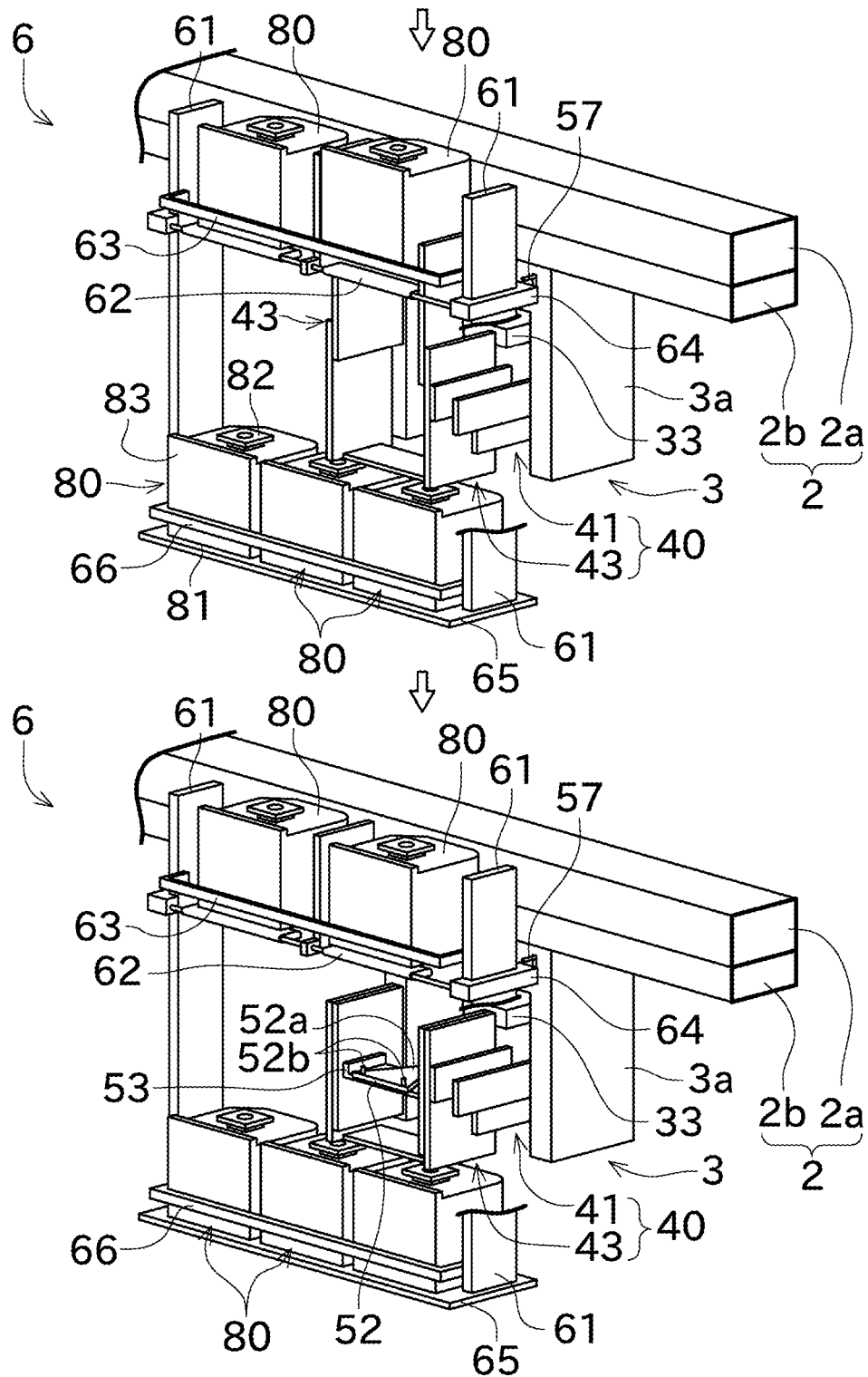
FIG. 9 is a perspective view illustrating FOUPs being placed on the upper shelf.

The holding base 52 holds a bottom surface 81 of the FOUP 80. To be specific, as shown in FIG. 5, FIG. 6, FIG. 9, etc., a holding surface 52a (a surface coming into contact with the bottom surface 81) of the holding base 52 has a plurality of insertion pins 52b located at predetermined positions. On the other hand, the bottom surface 81 of the FOUP 80 has a recess 81a having a predetermined shape, as shown in FIG. 6. The positions where the plurality of insertion pins 52b that corresponds to the shape of the recess 81a. Accordingly, by inserting the insertion pins 52b into the recess 81a, the FOUP 80 is able to be stably held. Provided near the holding base 52 is a guide 53 to prevent the FOUP 80 from mispositioning, and the like.

While the overhead transport vehicle 3 is traveling, the holding base 52 holds a FOUP 80. In the following description, a position where the overhead transport vehicle 3 holds a FOUP 80 while traveling will be referred to as a holding position. Holding a FOUP 80 by the holding base 52 is able to stabilize the FOUP 80. Alternatively, while the overhead transport vehicle 3 is traveling, a FOUP 80 may be held by both the chuck 51 and the holding base 52 or by the chuck 51 alone.

The overhead transport vehicle 3 includes: the lower shelf transfer device (second transfer device) 30 that moves a FOUP 80 located in the holding position, to place the FOUP 80 into the lower shelf 65 (downward transfer position); and the upper shelf transfer device (first transfer device) 40 that moves a FOUP 80 located in the holding position, to place the FOUP 80 into the upper shelf 62 (upper transfer position). The lower shelf transfer device 30 is used also to place a FOUP 80 into the load port 5.

First, the lower shelf transfer device 30 will be described. The lower shelf transfer device 30 is able to move the chuck 51 in the lateral direction (horizontal direction) (third movement), and also able to move the chuck 51 in the downward direction (fourth movement). As shown in FIG. 2, FIG. 5, and the like, the lower shelf transfer device 30 includes a lateral transfer mechanism 31 and a downward transfer mechanism 33. As shown in FIG. 4, the lateral transfer mechanism 31 is driven by a lateral transfer motor 32, and the downward transfer mechanism 33 is driven by a downward transfer motor 34.

The lateral transfer mechanism 31 moves the chuck 51 in the lateral direction (specifically, in a direction perpendicular to the forward direction in a plan view). More specifically, the lateral transfer mechanism 31 includes a plurality of movable plates that are able to move in the lateral direction. The chuck 51 moves integrally with the lowermost movable plate. The lateral transfer mechanism 31 uses power from the lateral transfer motor 32, to slide each of the movable plates in the lateral direction as shown in FIG. 5, thus causing the chuck 51 supported by the lateral transfer mechanism 31 to move in the lateral direction. As a result, the FOUP 80 is able to be moved in the lateral direction. In this preferred embodiment, the upper support surface 62a is located at a position higher than the upper end of the lateral transfer mechanism 31, and therefore, during lateral movement of the lateral transfer mechanism 31, the lateral transfer mechanism 31 does not come into contact with either the upper shelf 62 or the FOUP 80 supported by the upper shelf 62, for example.

The downward transfer mechanism 33 moves the chuck 51 in the downward direction. The downward transfer mechanism 33 is a hoist, for example, and is able to lower and retrieve a suspension, for example, a wire, as shown in FIG. 5, with power from the downward transfer motor 34. Accordingly, the FOUP 80 is able to be moved in the up-down direction.

The downward transfer mechanism 33 moves integrally with the lowermost movable plate of the lateral transfer mechanism 31. Thus, lateral movement of the lateral transfer mechanism 31 and downward movement of the downward transfer mechanism 33 are able to be compatible. Accordingly, a transfer position to which the lower shelf transfer device 30 is able to transfer a FOUP 80 is able to be located not only directly below and directly beside but also obliquely below.

Here, while a FOUP 80 is held by the holding base 52, interference among components occurs to disable movement of the FOUP 80 by the lower shelf transfer device 30 (especially the downward transfer mechanism 33). In this preferred embodiment, therefore, movement of the FOUP 80 by the lower shelf transfer device 30 is preceded by removal of the FOUP 80 from the holding base 52 and retraction of the holding base 52 from the lower side of the FOUP 80 (from a trajectory of the chuck 51 being moved downward by the lower shelf transfer device 30). For this retraction, the overhead transport vehicle 3 includes a retraction mechanism 55 and a retraction motor 56, as shown in FIG. 6.

The retraction mechanism 55 includes a link that is operated with power from the retraction motor 56. The link is rotatably coupled to the guide 53. The holding base 52 moves integrally with the guide 53 in a predetermined trajectory. Accordingly, by operating the link of the retraction mechanism 55 with power from the retraction motor 56, the holding base 52 and the guide 53 are able to be moved to the back side of the FOUP 80, that is, are able to be retracted from a position below the FOUP 80. Here, it may be acceptable that a temporary shelf (UTB: Under Track Buffer) suspended from the ceiling 7 is additionally provided below the rail 2. The temporary shelf is in a position overlapping the rail 2 in a plan view, and is installed with a phase shift from the load port 5 with respect to a direction in which the rail 2 extends. The second transfer device (the lower shelf transfer device 30) is able to transfer a FOUP 80 to the temporary shelf.

As described above, while the overhead transport vehicle 3 is traveling, a FOUP 80 is held by the holding base 52 and is not held by the chuck 51. To transfer the FOUP 80 to the lower shelf 65 or to the load port 5 after the overhead transport vehicle 3 stops, the chuck 51 holds the FOUP 80, and then the retraction motor 56 is driven to remove the holding base 52 from the FOUP 80 (that is, the holding of the FOUP 80 is switched between the holding stand 52 and the chuck 51). After that, transfer is performed by the lower shelf transfer device 30. The switching of the holding is able to also be performed while the overhead transport vehicle 3 is traveling. If, provisionally, the chuck 51 holds the FOUP 80 while the overhead transport vehicle 3 is traveling, the holding change of the FOUP 80 from the chuck 51 to the holding stand 52 is performed while the overhead transport vehicle 3 is traveling or after the overhead transport vehicle 3 stops.

The overhead transport vehicle 3 may run along the rail 2 with the chuck 51 holding the FOUP 80, preferably, for example, with the holding base 52 positioned directly below the FOUP 80 in order to prevent the FOUP 80 from falling. In this case, the holding base 52 may be retracted from below the FOUP 80 while the overhead transport vehicle 3 is traveling so that the second transfer device (lower shelf transfer device 30) is able to start transferring the FOUP 80 to the load port 5 or the temporary shelf (UTB) promptly after the overhead transport vehicle 3 stops running.

Next, the upper shelf transfer device 40 will be described mainly with reference to FIG. 7 and FIG. 8.

Figure 7:
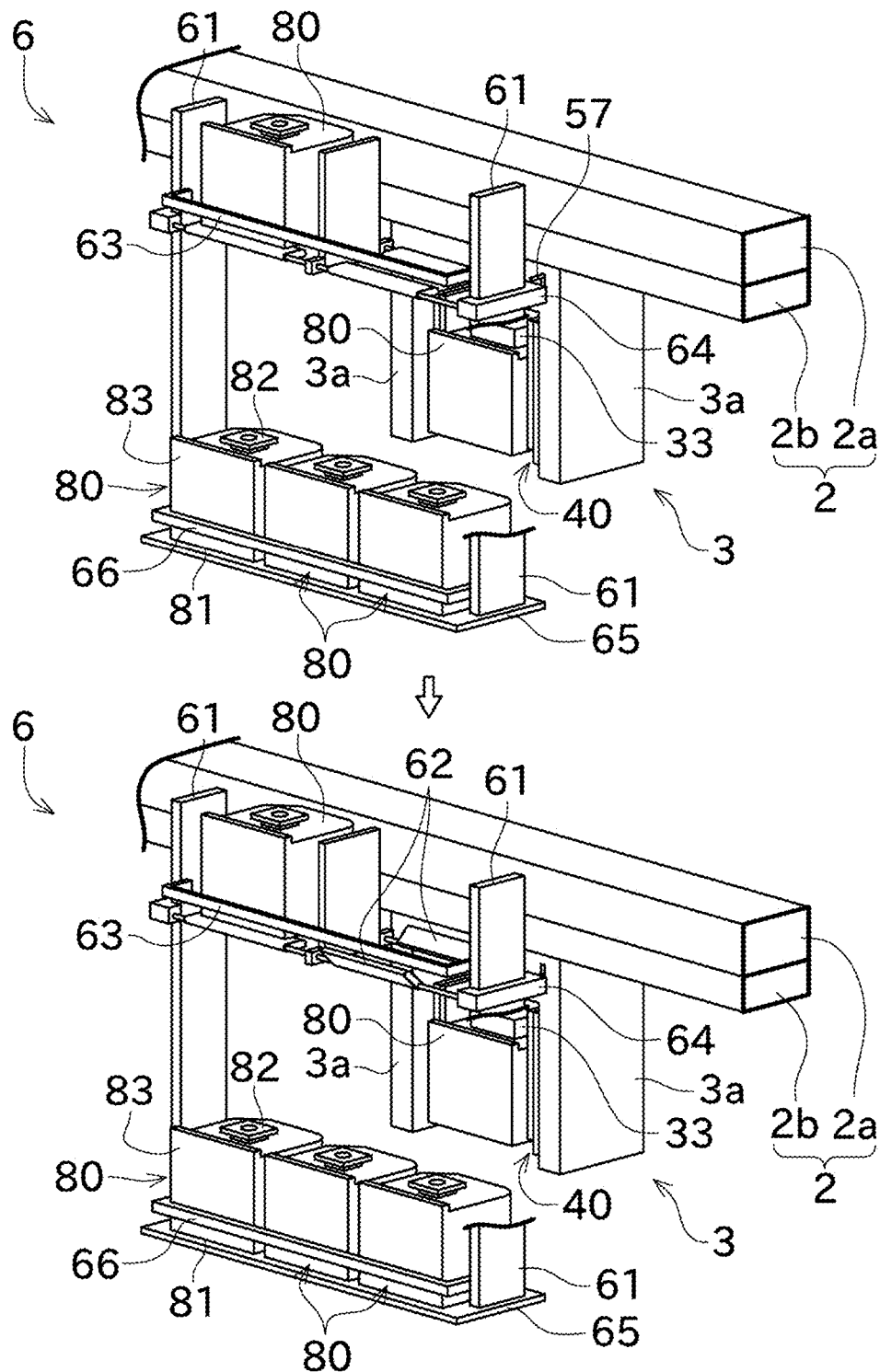
FIG. 7 is a perspective view illustrating an upper shelf being switched from a closed state to an open state.
Figure 8:
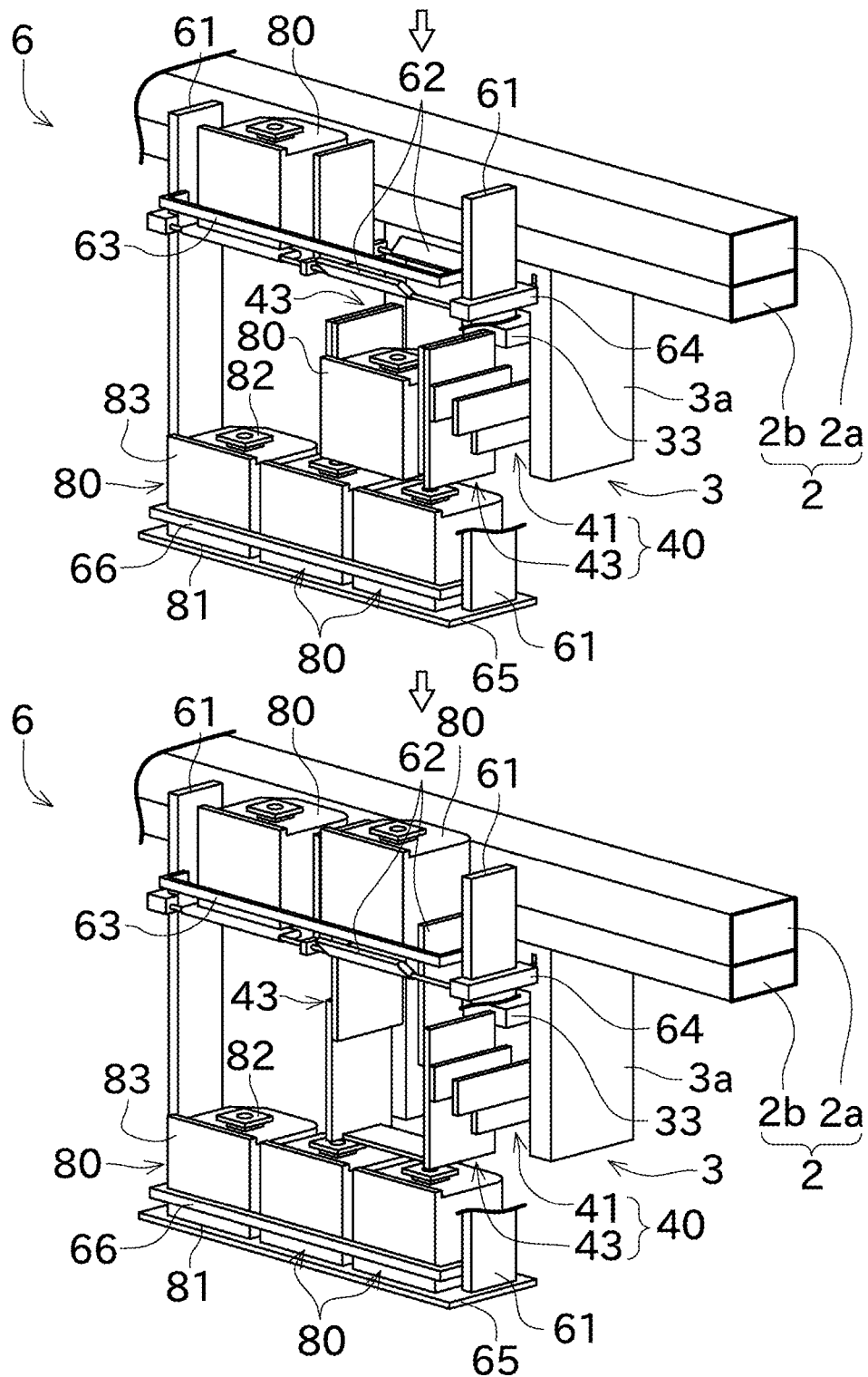
FIG. 8 is a perspective view illustrating a lateral slide mechanism and an upward slide mechanism of an upper shelf transfer device being operated.

As shown in FIG. 7 and FIG. 8, the upper shelf transfer device 40 is provided in a space between the covering 3a and a FOUP 80 with respect to the travel direction. The upper shelf transfer device 40 is able to move the holding base 52 in the lateral direction (first movement), and also able to move the holding base 52 in the upward direction (second movement). In the first movement, it is sufficient that the moving direction includes the lateral direction. Thus, directions other than the direct lateral direction are allowed. The same applies to the second and subsequent movements. As shown in FIG. 8, the upper shelf transfer device 40 includes a lateral slide mechanism 41 and an upward slide mechanism 43. As shown in FIG. 4, the lateral slide mechanism 41 is driven by a lateral slide motor 42, and the upward slide mechanism 43 is driven by an upward slide motor 44.

The lateral slide mechanism 41 moves the holding base 52 in the lateral direction (specifically, in a direction perpendicular to the forward direction in a plan view). More specifically, the lateral slide mechanism 41 includes a plurality of movable plates that are able to move in the lateral direction. The lateral slide mechanism 41 includes three movable plates that are coupled to one another by a belt or a chain. The holding base 52 moves integrally with the innermost movable plate. The lateral slide mechanism 41 uses power of the lateral slide motor 42, to slide each of the movable plates in the lateral direction as shown in FIG. 8, thus causing the holding base 52 supported by the lateral slide mechanism 41 to move in the lateral direction. As a result, the FOUP 80 is able to be moved in the lateral direction.

The upward slide mechanism 43 moves the holding base 52 in the upward direction. Specifically, the upward slide mechanism 43 includes a plurality of movable plates that are able to move in the upward direction. The holding base 52 moves integrally with the innermost movable plate. The upward slide mechanism 43 uses power from the upward slide motor 44, to slide each of the movable plates in the upward direction as shown in FIG. 8, thus causing the holding base 52 supported by the upward slide mechanism 43 to move in the upward direction. As a result, the FOUP 80 is able to be moved in the upward direction. In this preferred embodiment, during transfer of the FOUP 80 to the upper shelf 62, the upward slide mechanism 43 is positioned on a side surface of the FOUP 80. It therefore is necessary that the upper shelves 62 are spaced from each other by a large interval, in order to avoid interference of the upward slide mechanism 43 with another FOUP 80. Therefore, the number of FOUPs 80 that are able to be placed in one compartment of the upper shelf 62 is different from that of the lower shelf 65.

Next, referring to FIG. 7 to FIG. 9, how a FOUP 80 in the holding position is transferred to the upper shelf 62 will be described.

First, the overhead transport vehicle 3 stops on the lateral side of an upper shelf 62 defining and functioning as a transfer destination (the upper drawing in FIG. 7). Then, the overhead transport vehicle 3 moves the slide operator 57 to the pressing position, so that the upper shelf 62 is switched from the closed state to the open state (the lower drawing in FIG. 7). In a case where, unlike the preferred embodiment, the FOUP 80 is held by the chuck 51 alone while the overhead transport vehicle 3 is traveling; the chuck 51 is detached, and the FOUP 80 is held by the holding base 52.

Then, the overhead transport vehicle 3 operates the lateral slide mechanism 41, to move the FOUP 80 in the lateral direction (the upper drawing in FIG. 8). At this time, the FOUP 80 is positioned directly below the upper shelf 62. Then, the overhead transport vehicle 3 operates the upward slide mechanism 43, to move the FOUP 80 in the upward direction (the lower drawing in FIG. 8). At this time, to provide appropriate rotation of the upper shelf 62, the FOUP 80 is positioned above the upper transfer position. In this preferred embodiment, completion of the lateral movement by the lateral slide mechanism 41 is followed by upward movement by the upward slide mechanism 43. Alternatively, the upward movement is able to be started before completion of the lateral movement. As mentioned above, after lateral movement of the upper shelf transfer device 40 (lateral slide mechanism 41), its lower end is located above the upper end of a FOUP 80 supported by the lower shelf 65 (more specifically, is located at a position overlapping the upper end of the FOUP 80 in a plan view). Accordingly, interference of the lateral slide mechanism 41 with the FOUP 80 placed in the lower shelf 65 is prevented.

Then, the overhead transport vehicle 3 moves the slide operator 57 to the normal position, so that the upper shelf 62 is switched from the open state to the closed state (the upper drawing in FIG. 9). Then, the overhead transport vehicle 3 starts an operation to store the upward slide mechanism 43 and the lateral slide mechanism 41 into the overhead transport vehicle 3 (the lower drawing in FIG. 9).

Since the overhead transport vehicle 3 includes the upper shelf transfer device 40 while the ceiling suspended shelf 6 includes the upper shelf 62, a FOUP 80 is able to be placed at a high position (in this preferred embodiment, at the same level as that of the rail 2). Accordingly, a space in the factory is able to be effectively used, and more specifically a space directly beside the rail 2, which has not previously been effectively used. Especially in a factory that manufactures semiconductor products, a high cleanliness in the factory is required, and therefore the equipment cost increases as the space in the factory increases. Thus, the transport system 1 of this preferred embodiment is particularly effective in a factory that manufactures semiconductor products.

All of the overhead transport vehicles 3 included in the transport system 1 may include the upper shelf transfer devices or only a portion of the overhead transport vehicles 3 may include the upper shelf transfer device(s) 40. In the latter case, the lower shelf transfer devices 30 are preferably included, for example, in the portion of the overhead transport vehicles 3 and the lower shelf transfer devices 30 included in the rest of them have identical or similar features. Accordingly, the lower shelf is able to be commonly used by the portion and the rest of the overhead transport vehicles 3.

Next, referring to FIG. 10, a modification of the first preferred embodiment will be described.

The upper shelf transfer device 40 of the first preferred embodiment is provided with the upward slide mechanism 43 that slides the FOUP 80 upwardly. On the other hand, the upper shelf transfer device 40 of the first modification is provided with a vertical slide mechanism 430 that slides the FOUP 80 not only upwardly but also downwardly. A movable plate inside the slide mechanism 430 is able to move both up and down (second movement) from the normal position (standby position). The upper shelf transfer device 40 of the first modification is provided with a first holder 520 that holds a side surface 83 of the FOUP 80.

Figure 10:
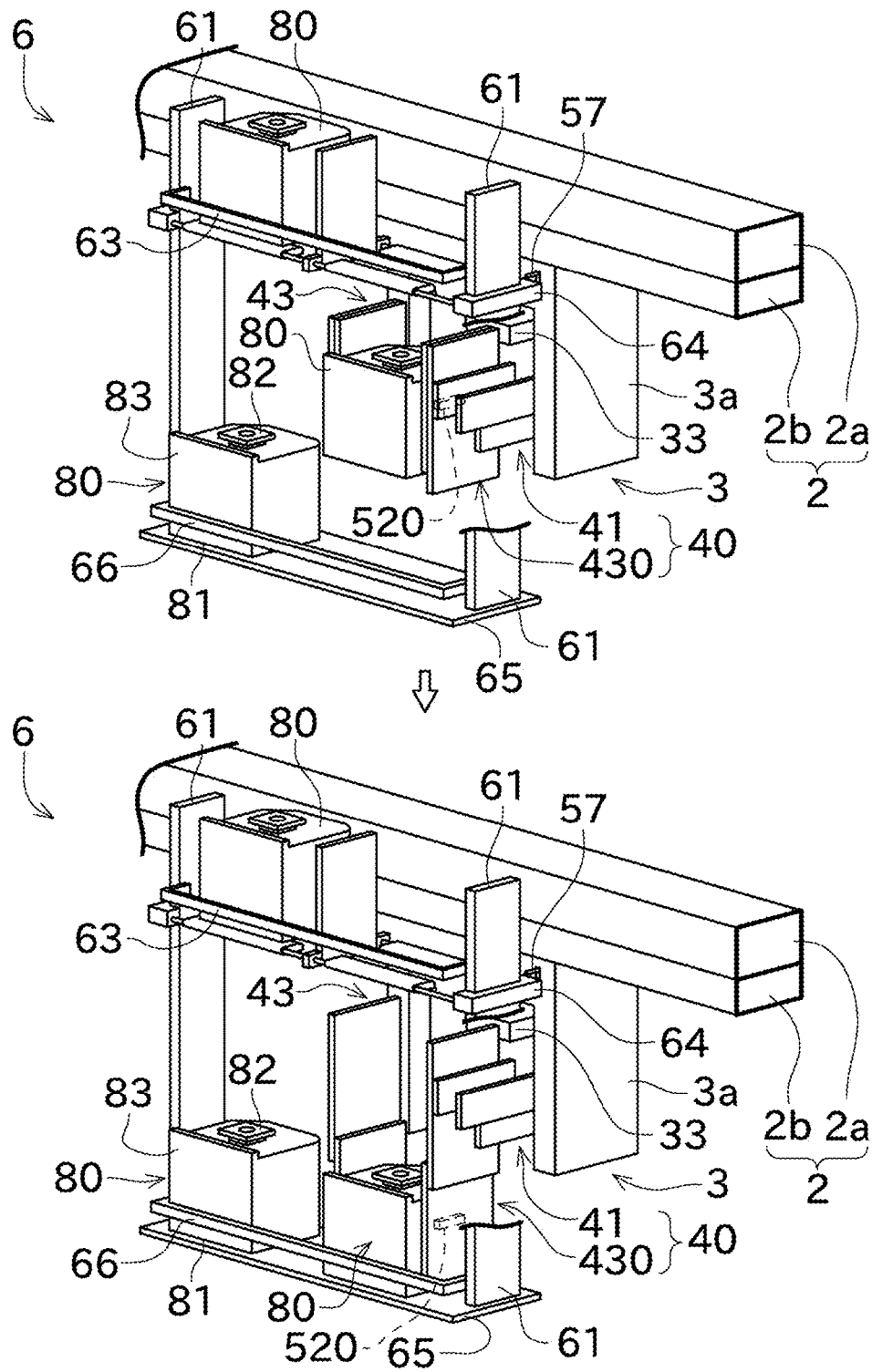
FIG. 10 is a perspective view illustrating that an upper shelf transfer device is able to also transfer a FOUP downwardly according to a modification of the first preferred embodiment of the present invention.

Accordingly, the upper shelf transfer device 40 of the first modification operates the lateral slide mechanism 41 to move the FOUP 80 (first holder 520) laterally (upper side of FIG. 10), and then operates the slide mechanism 430 to move the FOUP 80 (first holder 520) downwardly to place the FOUP 80 on the lower shelf 65 (lower side of FIG. 10). Thereafter, the upper shelf transfer device 40 releases the holding of the side 83 of the FOUP 80 by the first holder 520. Accordingly, the FOUP 80 is able to be transferred to the lower shelf 65 by the upper shelf transfer device 40. The upper shelf transfer device 40 of the first variation may move the FOUP 80 (first holder 520) downward by operating the slide mechanism 430 without operating the horizontal slide mechanism 41, and place the FOUP 80 on the temporary shelf (UTB) described above.

What has been described in the first preferred embodiment is also able to be applied to the first modification (and the second preferred embodiment described below) as long as no contradiction occurs. For example, the upper shelf transfer device 40 of the first modification may start the downward movement by the slide mechanism 430 before the lateral movement of the lateral slide mechanism 41 is completed.

The overhead transport vehicle 3 of the first modification may be provided with both the upper shelf transfer device 40 and the lower shelf transfer device 30, or may be provided with only the upper shelf transfer device 40 without the lower shelf transfer device 30.

Next, referring to FIG. 11 to FIG. 14, the second preferred embodiment will be described.

In the first preferred embodiment described above, the upper shelf transfer device 40 includes the lateral slide mechanism 41 and the lateral slide motor 42. The second preferred embodiment, on the other hand, has an upper shelf transfer device 90 is an arm mechanism including a plurality of arms that are rotatably coupled to one another.

Figure 11:
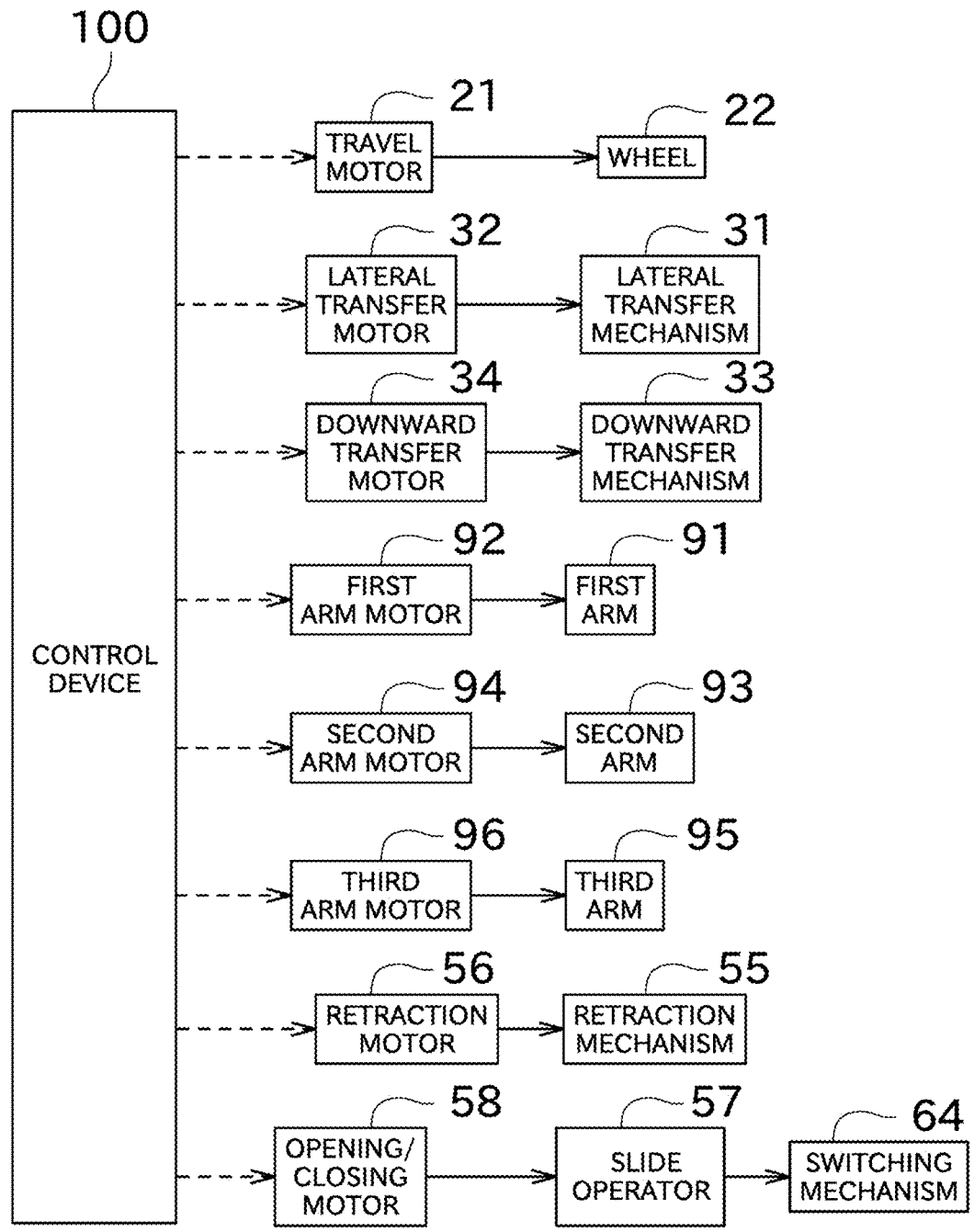
FIG. 11 is a block diagram showing a driver, and the like, provided in an overhead transport vehicle according to a second preferred embodiment of the present invention.
Figure 12:
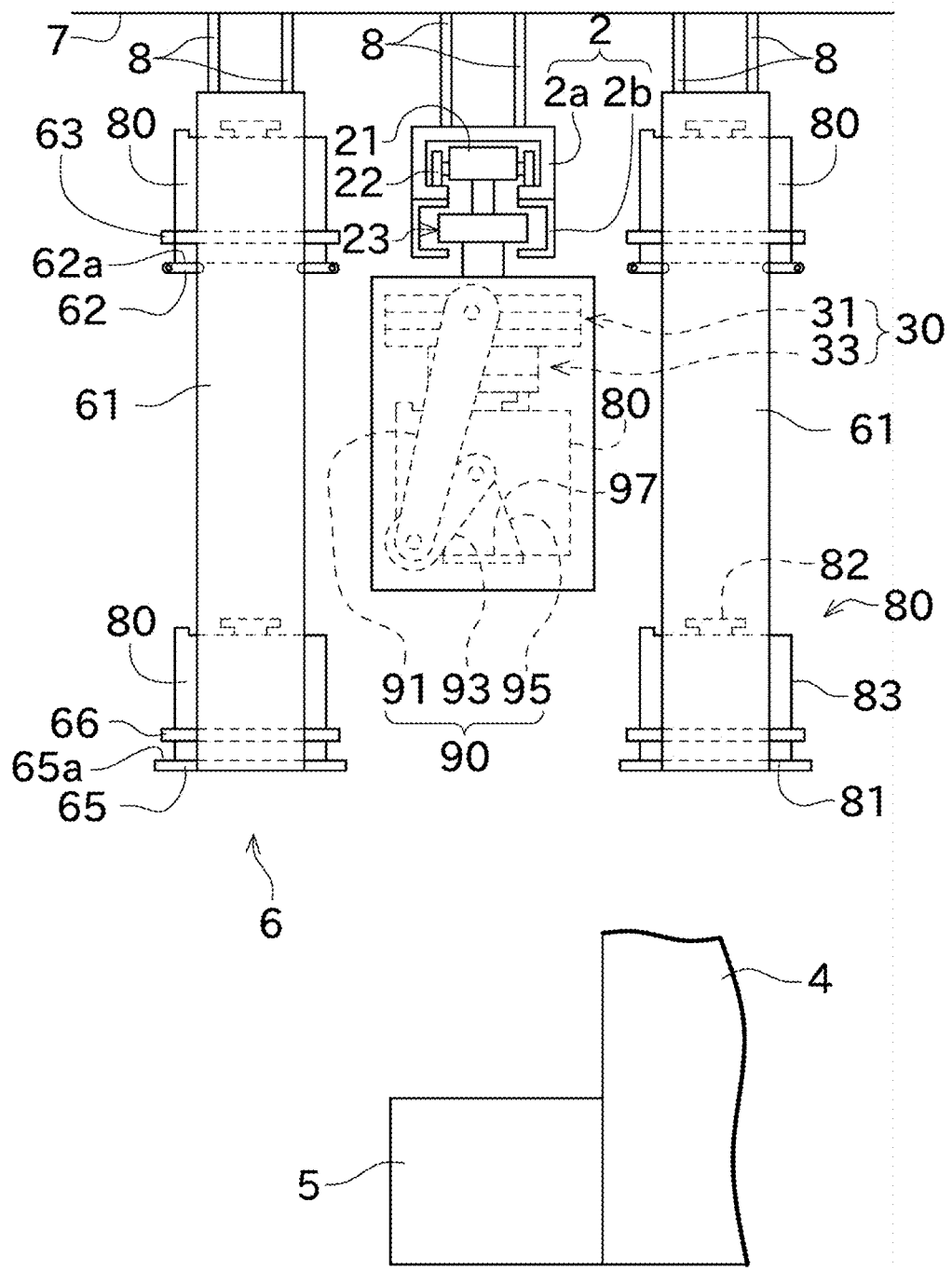
FIG. 12 is a front view showing an upper shelf transfer device according to a second preferred embodiment of the present invention.

To be specific, as shown in FIG. 12, the upper shelf transfer device 90 includes a first arm 91, a second arm 93, and a third arm 95 provided in this order from the side close to the overhead transport vehicle 3. As shown in FIG. 11, the first arm 91 is driven by a first arm motor 92, the second arm 93 is driven by a second arm motor 94, and the third arm 95 is driven by a third arm motor 96. Thus, the arms are able to operate independently of one another.

Figure 13:
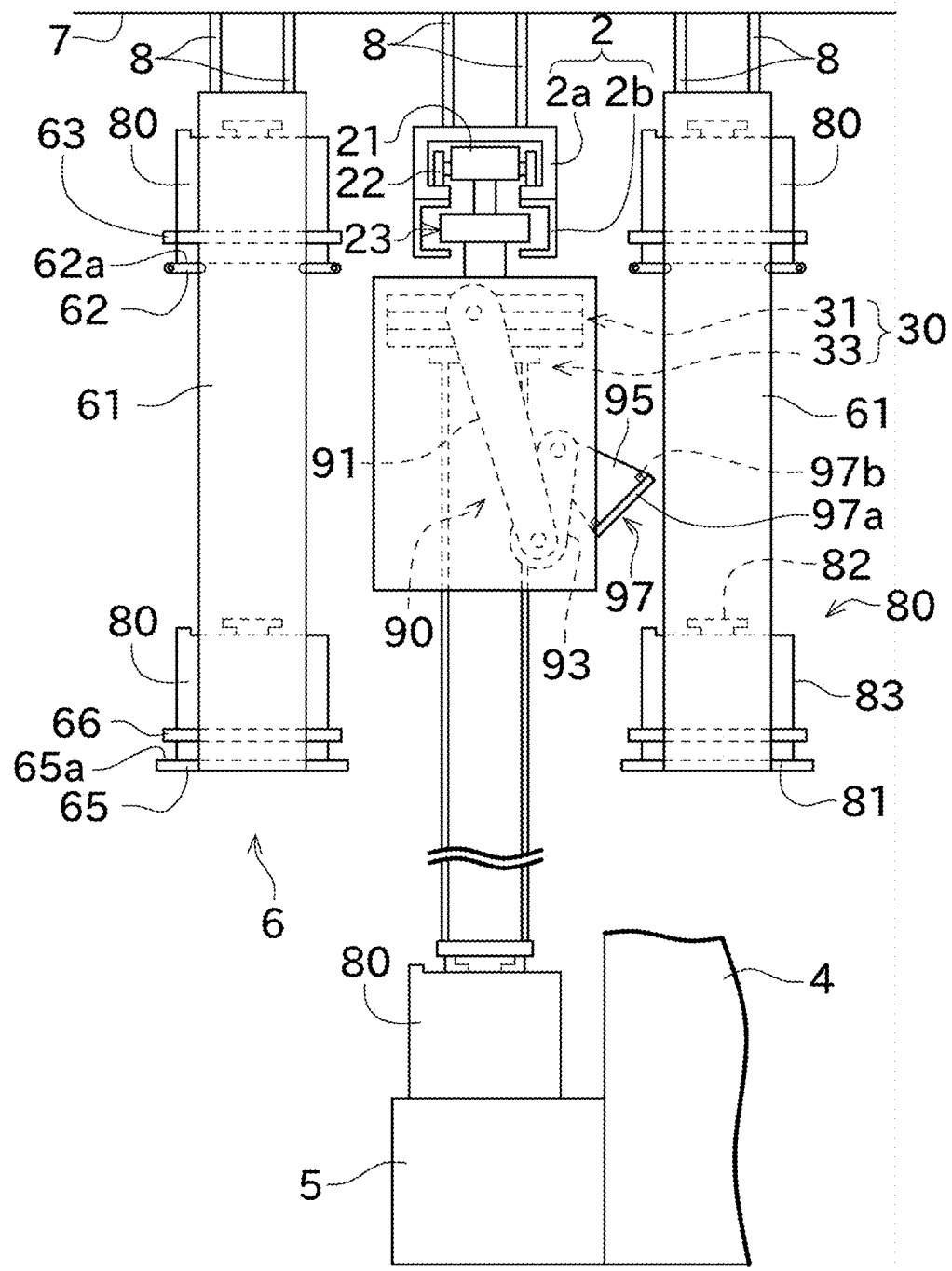
FIG. 13 is a front view illustrating a state where a first holder of an upper shelf transfer device is retracted according to a second preferred embodiment of the present invention.

The proximal end of the first arm 91 is coupled to the overhead transport vehicle 3, and the distal end of the first arm 91 is rotatably coupled to the proximal end of the second arm 93. The distal end of the second arm 93 is rotatably coupled to the proximal end of the third arm 95. Coupled to the distal end of the third arm 95 is a first holder 97. As shown in FIG. 13, an insertion pin 97b is formed on the holding surface 97a of the first holder 97.

To transfer a FOUP 80 by the lower shelf transfer device 30, adjusting the rotation angles of the first arm 91, the second arm 93, and the third arm 95 are able to retract the first holder 97 from below of the FOUP 80 (from the trajectory along which the lower shelf transfer device 30 moves the chuck 51 downward). Accordingly, the upper shelf transfer device 90 also defines and functions as a retraction mechanism. Accordingly, the FOUP 80 is able to be transferred by the lower shelf transfer device 30.

Figure 14:
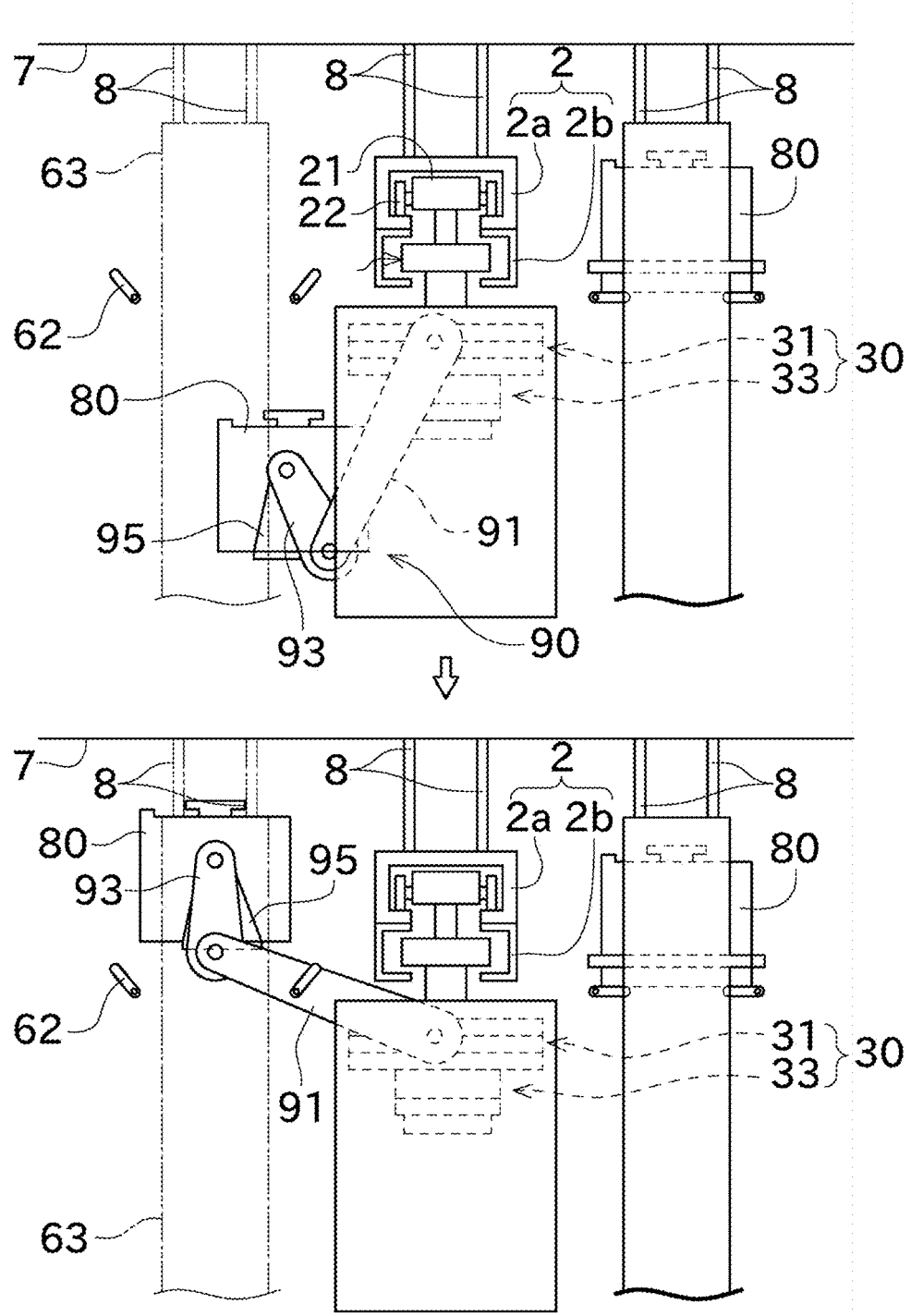
FIG. 14 is a front view illustrating an upper shelf transfer device of the second preferred embodiment being operated.

To transfer a FOUP 80 by the upper shelf transfer device 90, adjusting the rotation angles of the first arm 91, the second arm 93, and the third arm 95 are able to move the first holder 97 to the upper shelf 62 while keeping the first holder 97 horizontal, as shown in FIG. 14. More specifically, first, the FOUP 80 is held by the overhead transport vehicle 3, and in this state, the first arm 91 is rotated so that the first holder 97 moves mainly in the lateral direction (first movement; the upper drawing in FIG. 14). Then, as the rotation angle of the first arm 91 increases, the first holder 97 moves mainly in the upward direction (second movement; the lower drawing in FIG. 14). Since the rotation of the first arm 91 changes the rotation angles of the second arm 93 and the third arm 95, the second arm 93 and the third arm 95 are rotated to make the first holder 97 horizontal.

Next, referring to FIG. 15 to FIG. 17, a third preferred embodiment will be described. In the third preferred embodiment, a rotational operator (operator) 59 is used instead of the slide operator 57, to supply a driving force to the upper shelf 62.

Figure 15:
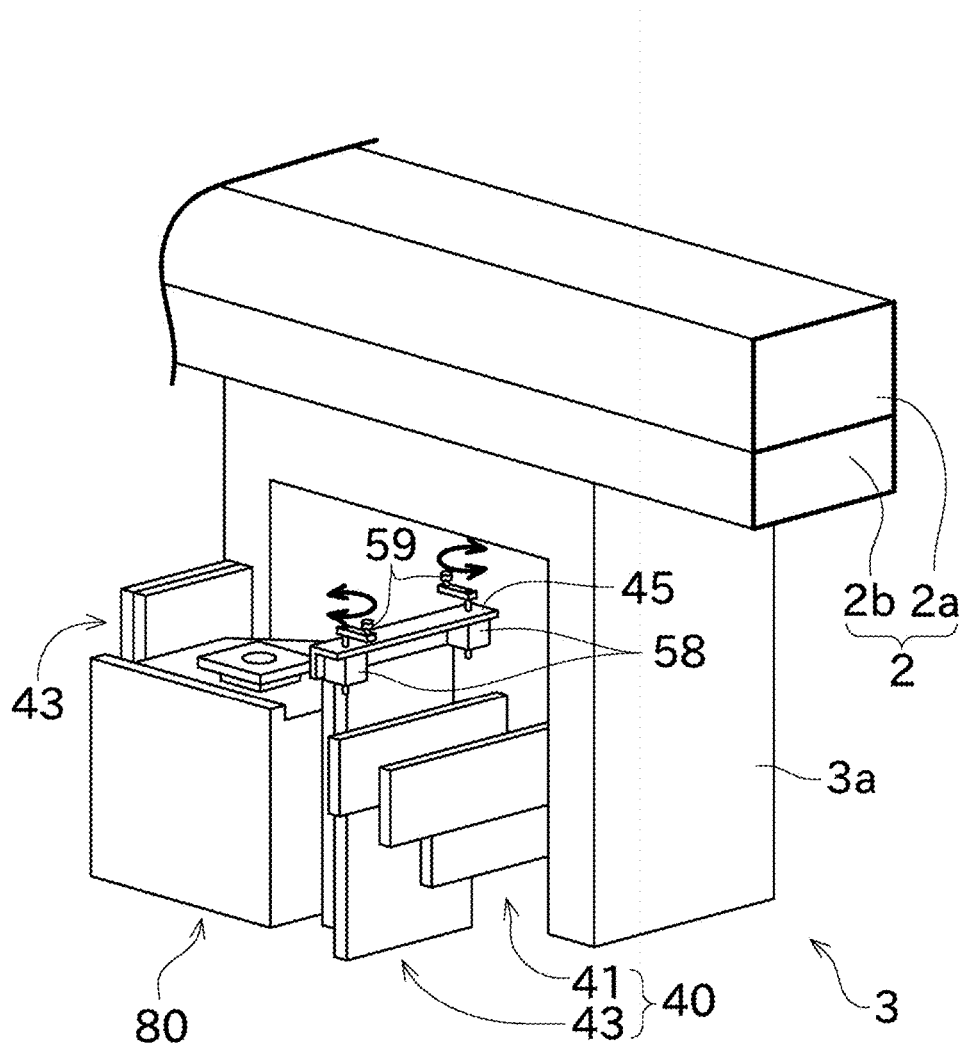
FIG. 15 is a perspective view showing an overhead transport vehicle according to a third preferred embodiment of the present invention.

As shown in FIG. 15, an overhead transport vehicle 3 according to the present preferred embodiment includes a motor mount 45 in addition to the opening/closing motor 58 and the rotational operator 59 described above. The motor mount 45 is attached to the upper shelf transfer device 40. The motor mount is attached to a portion of the upper shelf transfer device 40, the portion being moved in the first movement involving lateral movement of the holding base 52 (FOUP 80) but being not moved in the second movement involving upward movement of the holding base 52. Accordingly, the rotational operator 59 moves in the lateral direction in the first movement. Although the present preferred embodiment includes the motor mount 45 attached at only one side with respect to the forward direction, it is acceptable that the motor mounts 45 are attached on both sides.

Mounted to the motor mount 45 are the opening/closing motor 58 and the rotational operator 59. Like the foregoing preferred embodiment, the opening/closing motor 58 generates a driving force to switch the state of the upper shelf 62 between the open state and the closed state. The opening/closing motor 58 is able to control the rotation direction and the amount of rotation. The rotational operator 59 is rotated with a driving force generated by the opening/closing motor 58. Similarly to the slide operator 57, the rotational operator 59 transmits the driving force to the upper shelf 62 side. The motor mount 45, the opening/closing motor 58, and the rotational operator 59 are provided at such positions (for example, outside the upward slide mechanism 43) as to avoid interference with the second movement of the upward slide mechanism 43.

In the present preferred embodiment, two opening/closing motors 58 and two rotational operators 59 are provided side by side in a direction (left-right direction) perpendicular to both the forward direction and the up-down direction. The opening/closing motor 58 and the rotational operator 59 on one side in the left-right direction are used to transfer a FOUP 80 to the upper shelf 62 located on one side in the left-right direction, while the opening/closing motor 58 and the rotational operator 59 on the other side in the left-right direction are used to transfer a FOUP 80 to the upper shelf 62 located on the other side in the left-right direction. Alternatively, an opening/closing motor 58 and a rotational operator 59 may be commonly used in transfer of a FOUP 80 to either of the upper shelves 62 on one side and the other side in the left-right direction.

Figure 16:
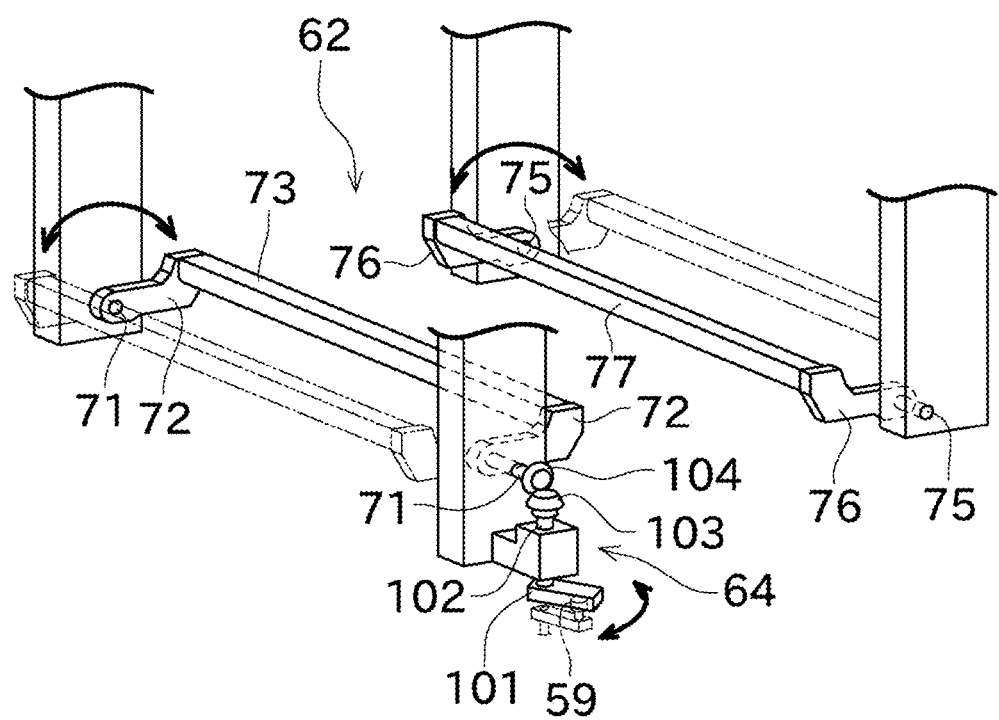
FIG. 16 is a perspective view showing an upper shelf according to a third preferred embodiment of the present invention.
Figure 17:
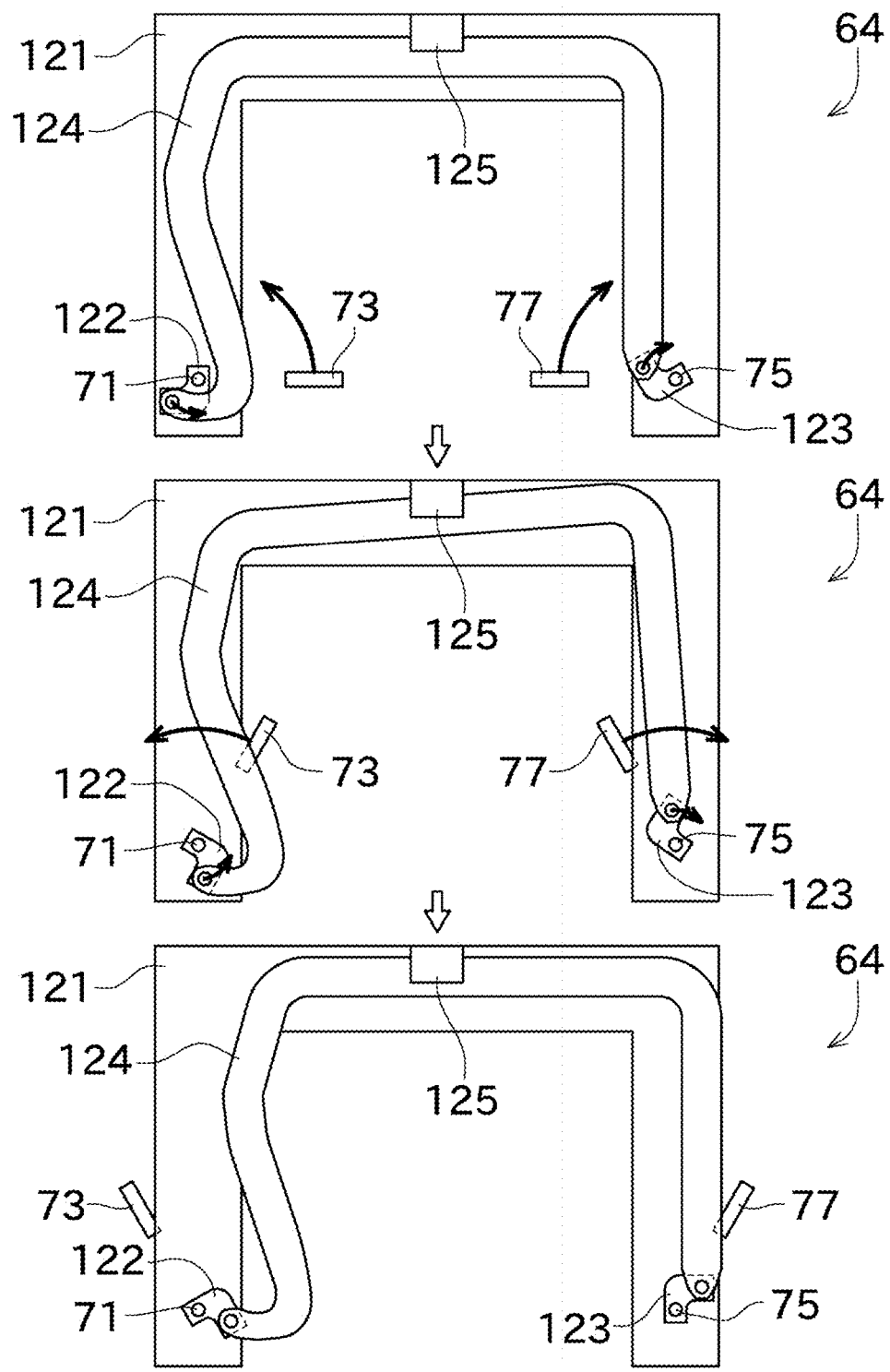
FIG. 17 is a front view showing how the upper shelf of the third preferred embodiment of the present invention switches from the closed state to the open state.

As shown in FIG. 16, the upper shelf 62 includes a first shaft 71, a first arm 72, a first support portion 73, a second shaft 75, a second arm 76, and a second support portion 77.

The first shaft 71 is rotatably mounted to a fixed portion (an immovable portion, e.g., the side plate 61 in the foregoing preferred embodiment) of the upper shelf 62. The first arm 72 rotates integrally with the first shaft 71 in the same direction as the first shaft 71. The first shaft 71 is fixed to one end portion of the first arm 72, while the first support portion 73 is fixed to the other end portion of the first arm 72. The first shaft 71 comprises a pair of first shafts 71, and the first arm 72 comprises a pair of first arms 72. The upper shelf 62 includes the first support portion 73, which connects the pair of first arms 72. The first support portion 73 is a portion that supports a FOUP 80. The first support portion 73 may be shaped like a rod or flat plate.

The second shaft 75, the second arm 76, and the second support portion 77 include structures that are identical or symmetrical to the first shaft 71, the first arm 72, and the first support portion 73. Thus, a FOUP 80 is supported by the first support portion 73 and the second support portion 77.

Accordingly, rotation of the first shafts 71 causes the first arms 72 and the first support portion 73 to rotate integrally. Rotation of the second shafts 75 causes the second arms 76 and the second support portion 77 to rotate integrally. Accordingly, the state of the upper shelf 62 is able to be switched between the closed state (solid lines) and the open state (chain lines). Accordingly, a driving force received from the overhead transport vehicle 3 (a driving force received from the outside of the upper shelf 62) is used to rotate the first shafts 71 and the second shafts 75. To switch between the closed state and the open state, the first shafts 71 and the second shafts 75 are preferably rotated in different directions, for example. Rotating the first shafts 71 and the second shafts 75 in the same direction causes, for example, the first support portion 73 to rotate upward while causing the second support portion 77 to rotate downward. In this case, a large space is occupied in the up-down direction. Accordingly, the first shafts 71 and the second shafts 75 are able to be rotated in the same direction, for example, to simplify the switching mechanism 64.

In the preferred embodiment, the driving force from the overhead transport vehicle 3 is transmitted to the first shaft 71 through a receiving portion 101, a receiving shaft 102, a first bevel gear 103, and a second bevel gear 104, which are included in the switching mechanism 64. The receiving portion 101 is rotatable about the receiving shaft 102 defining and functioning as the rotation axis. The receiving portion 101 is located at a position corresponding to a location of the rotational operator 59 after the first movement. Accordingly, the rotational operator 59 is rotated after the first movement, so that the receiving portion 101 and the receiving shaft 102 are rotated in accordance with the rotation direction and the amount of rotation of the rotational operator 59.

The first bevel gear 103 is fixed to the receiving shaft 102. The second bevel gear 104 is fixed to the first shaft 71. The first bevel gear 103 and the second bevel gear 104 are meshed with each other. Accordingly, the driving force is able to transmit from the rotational operator 59 to the first shaft 71 through the first bevel gear 103, the second bevel gear 104, and the like. Changing the rotation direction of the opening/closing motor 58 is able to change the rotation direction of the first shaft 71. The transmission of the driving force using the receiving portion 101, the receiving shaft 102, the first bevel gear 103, and the second bevel gear 104 is just an example, and may be altered as appropriate.

In the present preferred embodiment, the driving force used to rotate the first shafts 71 is further transmitted to the second shafts 75 by the switching mechanism 64, so that the second shafts 75 are rotated in the direction reverse to the rotation direction of the first shafts 71. Thus, the first shafts 71 and the second shafts 75 are able to be driven to switch the state of the upper shelf 62 from the open state to the closed state by the single driver. A specific implementation of the switching mechanism 64 varies among the preferred embodiments.

In the present preferred embodiment, the state of the upper shelf 62 is able to be switched from the closed state to the open state by rotating the opening/closing motor 58 in the reverse direction, because it causes the first shafts 71 and the second shafts 75 to rotate in directions reverse to the directions in which they rotate to switch from the open state to the closed state.

The switching mechanism 64 of the third preferred embodiment includes a link support portion 121 to support a first shaft link 122, a second shaft link 123, a coupling link 124, and a clamping plate 125.

The first shaft link 122, which is fixed to the first shaft 71, rotates integrally with the first shaft 71 in the same direction. The second shaft link 123, which is fixed to the second shaft 75, rotates integrally with the second shaft 75 in the same direction. A portion of the coupling link 124 on the first shaft 71 side is rotatably coupled to the first shaft link 122, and a portion thereof on the second shaft 75 side is rotatably coupled to the second shaft link 123. The clamping plate 125 normally does not cramp the coupling link 124. Only when the coupling link 124 largely moves in the axial direction of the first shaft 71, etc., the clamping plate 125 comes into contact with the coupling link 124 to prevent more movement.

As the first shaft 71 is rotated, the first shaft link 122 is integrally rotated. As the first shaft link 122 is rotated, the coupling link 124 operates so that the second shaft link 123 is rotated. Consequently, the second shaft 75 rotates in a direction different from that of the first shaft 71.

Depending on the shape and coupling position of the coupling link 124, the first shaft 71 and the second shaft 75 may be rotated in the same direction. In this preferred embodiment, however, the second shaft 75 receives a driving force from the first shaft 71, to thus be rotated in the direction reverse to the rotation direction of the first shaft 71. For example, in the upper drawing in FIG. 17, rotation of the first shaft 71 causes a coupling portion between the first shaft link 122 and the coupling link 124 to be rotated toward the inside while passing through the lower side of the first shaft 71. This driving force is transmitted to the second shaft link 123 via the coupling link 124. A coupling portion between the second shaft link 123 and the coupling link 124 is located above the second shaft 75, and therefore is rotated toward the outside while passing through the upper side of the second shaft 75. Consequently, the first shaft 71 and the second shaft 75 are rotated in different directions.

As thus far described, according to the coupling link 124 and the like, just rotating the first shaft 71 toward one side is able to rotate the second shaft 75 toward the other side. As a result, the first support portion 73 and the second support portion 77 are able to be rotated outward as shown in FIG. 17, so that the state of the upper shelf 62 is able to be switched from the closed state to the open state. Likewise, by rotating the first shaft 71 in another direction, the state of the upper shelf 62 is able to be switched from the open state to the closed state.

As thus far described, the overhead transport vehicle 3 of the above preferred embodiments travels along the rail 2 provided on the ceiling 7 of the building to transport the FOUP 80. The overhead transport vehicle 3 includes the holding base 52 and the upper shelf transfer device 40. The holding base 52 holds the bottom surface 81 of the FOUP 80. The upper shelf transfer device 40 moves the holding base 52 at least upwardly while holding the FOUP 80. The upper shelf transfer device 40 moves the holding base 52 from the holding position in which the holding base 52 holds and transfers the holding base 52 to the upper transfer position to transfer the FOUP 80 which is a different position from the holding position in a plan view and higher than the holding position.

Accordingly, the FOUPs 80 are able to be placed at a high position in a space that has conventionally not been available to place FOUPs 80. Accordingly, a space in the building is able to be more effectively used.

In the overhead transport vehicle 3 of the modification of the first preferred embodiment, the upper shelf transfer device 40 moves the first holder 520 downward.

Accordingly, the upper shelf transfer device 40 is able to transfer the FOUP 80 to any of the upper or lower positions.

In the overhead transport vehicle 3 of the above preferred embodiments, upper shelf transfer device 40 moves the holding base 52 in a lateral direction through a first movement in which components of a moving direction includes a lateral direction, moves the holding base 52 upward through a second movement in which components of a moving direction includes an upward direction, and transfers the FOUP 80 to the upper transfer position.

As a result, the holding base 52 is able to be moved to the upper transfer position while preventing interference between the overhead transport vehicle 3 and the FOUP 80.

The overhead transport vehicle 3 of the above preferred embodiments includes the opening/closing motor 58 and the operator (slide operator 57 or the rotational operator 59). The operator enables the upper shelf 62 to be a state (open state) transferred the FOUP 80 by providing a driving force generated by the opening/closing motor 58 to the upper shelf 62 positioned at the upper transfer position. The opening/closing motor 58 and the operator is moved in the lateral direction by the first movement.

By using the driving force generated by the opening/closing motor 58 of the overhead transport vehicle 3, a driver to change opening/closing the upper shelf 62 side is no longer required. In addition, as the opening/closing motor 58 and the operator are able to be moved in the lateral direction, the operator is able to be closer to the upper shelf 62 by using the same mechanism as the FOUP 80.

The overhead transport vehicle 3 of the modification of the first preferred embodiment moves the first holder 520 in the lateral direction by the first movement in which components of the moving direction includes the lateral direction, moves the first holder 520 downward by the second movement in which components of moving direction includes the downward direction, and transfers the FOUP 80 to the lower transfer position.

As a result, the first holder 520 is able to be moved to the lower transfer position while preventing interference between the overhead transport vehicle and the FOUP 80.

In the overhead transport vehicle 3 of the above preferred embodiments, the upper shelf transfer device 40 raises the holding base 52 to at least the same height as the rail 2.

Accordingly, a space at the same height of the rail 2 is able to be more effectively used.

The overhead transport vehicle 3 of the above preferred embodiments includes the chuck 51 and the lower shelf transfer device 30. The chuck 51 holds the side surface or the top surface of the FOUP 80. The lower shelf transfer device 30 moves the chuck 51 at least downwardly while holding the FOUP 80.

Accordingly, the FOUP 80 is able to be placed not only at a position higher than the overhead transport vehicle, but also at a position lower than the overhead transport vehicle 3. Therefore, the space in the building is able to be used further effectively.

In the overhead transport vehicle 3 of the above preferred embodiments, the upper shelf transfer device 40 includes the retraction mechanism 55 that retracts the holding base 52 from a trajectory of the chuck 51 being moved downward by the lower shelf transfer device 30.

As a result, the FOUP 80 is able to be transferred downward while preventing interference between the holding base 52 and the FOUP 80.

In the overhead transport vehicle 3 of the above preferred embodiments, lower shelf transfer device 30 moves the chuck 51 in the lateral direction by the third movement in which components of the moving direction includes the lateral direction, moves the chuck 51 downward by the fourth movement in which components of the moving direction includes a lower direction, and transfers the FOUP 80 to the lower transfer position. The upper shelf transfer device 40 moves the holding base 52 upward to the higher position than the height of the holding base 52 when the lower shelf transfer device 30 moves it in the lateral direction.

In the overhead transport vehicle 3 of the preferred embodiments, the lower end position of the upper shelf transfer device 40 after the first movement is higher than the upper end of the FOUP 80 transferred to the lower transfer position.

As a result, even if the upper shelf transfer device 40 is moved in the lateral direction, the upper shelf transfer device 40 and the FOUP 80 transferred to the lower transfer position do not interfere with each other.

This prevents interference between the FOUP 80 transferred to the upper transfer position and the lower shelf transfer device 30, so that even after the FOUP 80 is transferred to the upper transfer position, another FOUP 80 is able to be transferred to the lower transfer position.

In the overhead transport vehicle 3 of the first preferred embodiment, the upper shelf transfer device 40 includes the lateral slide mechanism 41 and the upward slide mechanism 43. The lateral slide mechanism 41 slides the holding base 52 in the lateral direction. The upward slide mechanism 43 slides the holding base 52 in the upward direction.

Accordingly, the upper shelf transfer device 40 is able to be implemented with a simple structure.

In the overhead transport vehicle 3 of the second preferred embodiment, the upper shelf transfer device 40 includes the arm mechanism including a plurality of arms (the first arm 91, the second arm 93, and the third arm 95) rotatably connected to each other. The arms are operated independently to move the holding base 52 from the holding position to the upper transfer position.

Accordingly, the upper shelf transfer device 40 is able to be implemented with a simple structure.

In the overhead transport vehicle 3 of the above preferred embodiments, the FOUP 80 is a wafer transport container. The holding base 52 (the first holder 97) includes the holding surface 52a (holding surface 97a) and the insertion pin 52b. The holding surface 52a holds the FOUP 80. The insertion pin 52b (the insertion pin 97b) is formed on the holding surface 52a and inserts into the recess in the lower surface of the FOUP 80.

Accordingly, since the holding base 52 includes the holding surface 52a and the insertion pin 52b, the FOUP 80 is able to be transferred stably.

The overhead transport vehicle 3 of the above preferred embodiments travels along the rail 2 and transports the FOUP 80 with the holding base 52 holding the FOUP 80.

Accordingly, the FOUP 80 is able to be transported in a stable state.

In the overhead transport vehicle 3 of the above preferred embodiments, the chuck 51 holds the flange portion 82 of the upper surface of the FOUP 80.

Accordingly, the top surface of the FOUP 80 is able to be held with a simple structure.

The overhead transport vehicle 3 of the above preferred embodiments switches the FOUP 80 between the holding base 52 and the chuck 51 while traveling along the rail 2.

Accordingly, the FOUP 80 is able to be transferred promptly after the overhead transport vehicle stops.

While preferred embodiments and variations and modifications thereof according to the present invention have been described above, the features described above may be modified, for example, as follows.

Although in the foregoing preferred embodiments, the ceiling suspended shelf 6 includes the upper shelf 62 and the lower shelf 65, a structure of the ceiling suspended shelf 6 that includes only the upper shelf 62 may be provided. Although in the foregoing preferred embodiments, two FOUPs 80 are able to be placed in one compartment of the upper shelf 62 while three FOUPs 80 are able to be placed in one compartment of the lower shelf 65, the number of FOUPs 80 that are able to be placed may be changed. The number of FOUPs 80 that are able to be placed in the upper shelf 62 may be equal to the number of FOUPs 80 that are able to be placed in the lower shelf 65. Alternatively, the number of FOUPs 80 that are able to be placed may be larger in the upper shelf 62.

In the foregoing preferred embodiments, the upper shelf transfer device 40 transfers the FOUP 80 to the upper shelf 62 by the first movement involving lateral movement and the second movement involving upward movement. The FOUP 80, however, may be moved in a different way. For example, the first movement may be preceded by slight downward movement to separate the FOUP 80 from the overhead transport vehicle 3.

The chuck 51 may be changed to hold the side surface 83 (including protrusions formed on the side surface, etc.) of the FOUP 80 in addition to, or instead of, the flange portion 82. The holding base 52 may be changed to hold the side surface 83 (including protrusions formed on the side surface, etc.) of the FOUP 80 in addition to, or instead of the bottom surface 81.

The slide operator 57 of the first preferred embodiment provides a driving force resulting from linear motion to the switching mechanism 64, while the rotational operator 59 of the third preferred embodiment provides a driving force resulting from rotational motion to the switching mechanism 64. In both of these cases, the driving force supply is implemented by contacting. Instead, the operator may contactlessly supply the driving force by, for example, a magnet gear.

Although the foregoing preferred embodiments deal with the transport system 1 that is installed in a factory that manufactures semiconductor products, this transport system 1 is able to be installed in a factory that manufactures other products, too. This transport system 1 is able to be installed in a building (e.g., a warehouse) other than manufacturing factories.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. An overhead transport vehicle that travels along a rail on a ceiling of a building to transport an article, the overhead transport vehicle comprising:
a first holder to hold at least one of a side surface and a bottom surface of the article;
a first transfer device to move the first holder;
a driver; and an operator to provide a driving force generated by the driver to an upper shelf positioned at an upper transfer position; wherein
    the first transfer device moves the first holder at least upwardly while holding the article from a holding position in which the first holder holds and transfers the article to an upper transfer position to transfer the article, which is a different position from the holding position in a plan view and higher than the holding position; and
    the operator enables the upper shelf to be transferred by providing the driving force generated by the driver to the upper shelf positioned at the upper transfer position; and
    the first transfer device is able to raise the first holder to at least a same height as the rail.

2. The overhead transport vehicle according to claim 1, wherein the first transfer device is able to move the first holder downward.

3. The overhead transport vehicle according to claim 2, wherein
    the first transfer device is able to move the first holder in a lateral direction through a first movement in which components of a moving direction include a lateral direction;
    the first transfer device is able to move the first holder downward through a second movement in which components of a moving direction include a downward direction; and
    the first transfer device is able to transfer the article to a lower transfer position.

4. The overhead transport vehicle according to claim 1, wherein
    the first transfer device is able to move the first holder in a lateral direction through a first movement in which components of a moving direction include a lateral direction;
    the first transfer device is able to move the first holder upward through a second movement in which components of a moving direction include an upward direction; and
    the first transfer device is able to transfer the article to the upper transfer position.

5. The overhead transport vehicle according to claim 4, wherein
    the driver and the operator are movable in the lateral direction by the first movement.

6. The overhead transport vehicle according to claim 1, wherein the first transfer device includes:
    a lateral slide mechanism to slide the first holder in a lateral direction; and
    an upward slide mechanism to slide the first holder in an upward direction.

7. The overhead transport vehicle according to claim 1, wherein
    the first transfer device includes an arm mechanism including a plurality of arms rotatably connected to each other; and
    the arms are operable independently to move the first holder from the holding position to the upper transfer position.

8. The overhead transport vehicle according to claim 1, wherein
    the article is a wafer transport container to transport wafers; and
    the first holder includes:
        a holding surface to hold the wafer transport container; and
        an insertion pin on the holding surface and that is insertable into a recess in a lower surface of the wafer transport container.

9. The overhead transport vehicle according to claim 8, wherein the overhead transport vehicle is able to transport the wafer transport container by traveling along the rail with the first holder holding the wafer transport container.

10. An overhead transport vehicle that travels along a rail on a ceiling of a building to transport an article, the overhead transport vehicle comprising:
    a first holder to hold at least one of a side surface and a bottom surface of the article;
    a first transfer device to move the first holder;
    a second holder to hold at least one of the side surface and a top surface of the article; and
    a second transfer device to move the second holder at least downward while holding the article; wherein
    the first transfer device moves the first holder at least upwardly while holding the article, from a holding position in which the first holder holds and transfers the article to an upper transfer position to transfer the article, which is a different position from the holding position in a plan view and higher than the holding position.

11. The overhead transport vehicle according to claim 10, wherein the first transfer device includes a retractor to retract the first holder from a trajectory of the second holder being moved downward by the second transfer device.

12. The overhead transport vehicle according to claim 10, wherein:
    the second transfer device is able to move the second holder in a lateral direction through a third movement in which components of a moving direction include a lateral direction;
    the second transfer device is able to move the second holder downward through a fourth movement in which components of a moving direction include a downward direction and transfers the article to a lower transfer position; and
    the first transfer device is able to move the first holder upward to a higher position than a height of the first holder when the second transfer device moves the first holder in the lateral direction.

13. The overhead transport vehicle according to claim 12, wherein a lower end position of the first transfer device after the first movement is higher than an upper end of the article transferred to the lower transfer position.

14. The overhead transport vehicle according to claim 10, wherein
    the article is a wafer transport container to transport wafers; and
    the second holder is a chuck to hold a flange portion of the top surface of the wafer transport container.

15. The overhead transport vehicle according to claim 10, wherein the overhead transport vehicle is able to switch the article between the first holder and the second holder while traveling along the rail.

* * * * *